US012793590B2

(12) United States Patent
Lee et al.

(10) Patent No.: US 12,793,590 B2
(45) Date of Patent: Nov. 10, 2026

(54) DISPLAY APPARATUS

(71) Applicant: Samsung Display Co., Ltd., Yongin-si (KR)

(72) Inventors: Seungjun Lee, Yongin-si (KR); Kyungho Kim, Yongin-si (KR); Junggun Nam, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/209,679

(22) Filed: May 15, 2025

(65) Prior Publication Data

US 2025/0356785 A1 Nov. 20, 2025

(30) Foreign Application Priority Data

May 17, 2024 (KR) ........................ 10-2024-0064804

(51) Int. Cl.

| | |
|---|---|
| ***G09G 3/00*** | (2006.01) |
| ***G01L 5/101*** | (2020.01) |
| ***G09G 3/32*** | (2016.01) |
| ***G09G 3/3233*** | (2016.01) |
| ***H10H 29/852*** | (2025.01) |

(Continued)

(52) U.S. Cl.

CPC .............. *G09G 3/006* (2013.01); *G01L 5/101* (2013.01); *G09G 3/035* (2020.08); *G09G 3/32* (2013.01); *G09G 3/3233* (2013.01); *H10H 29/852* (2025.01); *H10K 59/873* (2023.02); *G09G 2320/0233* (2013.01); *G09G 2320/0242* (2013.01); *G09G 2320/0285* (2013.01); *G09G 2330/12* (2013.01); *G09G 2380/02* (2013.01); *H10K 2102/311* (2023.02)

(58) Field of Classification Search

None

See application file for complete search history.

(56) References Cited

U.S. PATENT DOCUMENTS

| | | | |
|---|---|---|---|
| 9,563,320 | B2 | 2/2017 | Lee et al. |
| 10,008,553 | B2 | 6/2018 | Ito |
| 10,497,306 | B2 | 12/2019 | Lee |

(Continued)

FOREIGN PATENT DOCUMENTS

| | | | |
|---|---|---|---|
| CN | 113470560 | B | 8/2023 |
| JP | 6592104 | B2 | 9/2019 |

(Continued)

*Primary Examiner* — Ifedayo B Iluyomade

(74) *Attorney, Agent, or Firm* — Womble Bond Dickinson (US) LLP

(57) ABSTRACT

A display apparatus includes a display layer including a display area and a non-display area outside the display area, a strain sensor layer including first sensing lines extending in a first direction in the display area and second sensing lines extending in a second direction in the display area, a display driving unit configured to provide image data to the plurality of pixels, and a stretch compensation unit configured to divide the display area into a plurality of sub-areas, to generate comparison data obtained by comparing a measurement voltage value with a reference voltage value for each of the first sensing lines and the second sensing lines, and to generate stretch compensation data correcting the image data in a unit of sub-areas based on the comparison data.

19 Claims, 44 Drawing Sheets

(51) Int. Cl.
*H10K 59/80* (2023.01)
*H10K 102/00* (2023.01)

(56) References Cited

U.S. PATENT DOCUMENTS

| | | | | |
|---|---|---|---|---|
| 10,614,757 | B2 | 4/2020 | Takizawa et al. | |
| 10,679,566 | B2 | 6/2020 | Jeon et al. | |
| 10,930,209 | B2 | 2/2021 | Choi et al. | |
| 11,037,478 | B2 | 6/2021 | Ahn et al. | |
| 11,953,951 | B2 | 4/2024 | Lee et al. | |
| 2021/0264837 | A1* | 8/2021 | Ahn | G09G 3/035 |
| 2024/0029605 | A1 | 1/2024 | Yang et al. | |

FOREIGN PATENT DOCUMENTS

| | | | |
|---|---|---|---|
| KR | 10-2016-0025889 | A | 3/2016 |
| KR | 10-2017-0130283 | A | 11/2017 |
| KR | 10-2018-0031893 | A | 3/2018 |
| KR | 10-2018-0072022 | A | 6/2018 |
| KR | 10-2020-0081945 | A | 7/2020 |
| KR | 10-2022-0079310 | A | 6/2022 |
| KR | 10-2484880 | B1 | 1/2023 |
| KR | 10-2023-0027355 | A | 2/2023 |
| KR | 10-2023-0084357 | A | 6/2023 |

* cited by examiner

FIG. 18A

| | Col. 1 | Col. 2 | Col. 3 |
|---|---|---|---|
| Row. 1 | (Vh1, Vv1) | (Vh1, Vv2) | (Vh1, Vv3) |
| Row. 2 | (Vh2, Vv1) | (Vh2, Vv2) | (Vh2, Vv3) |
| Row. 3 | (Vh3, Vv1) | (Vh3, Vv2) | (Vh3, Vv3) |

FIG. 18B

| | Col. 1 | Col. 2 | Col. 3 |
|---|---|---|---|
| Row. 1 | (Bv_h1, Bv_v1) | (Bv_h1, Bv_v2) | (Bv_h1, Bv_v3) |
| Row. 2 | (Bv_h2, Bv_v1) | (Bv_h2, Bv_v2) | (Bv_h2, Bv_v3) |
| Row. 3 | (Bv_h3, Bv_v1) | (Bv_h3, Bv_v2) | (Bv_h3, Bv_v3) |

DISPLAY APPARATUS

CROSS-REFERENCE TO RELATED APPLICATION

The present application claims priority to and the benefit of Korean Patent Application No. 10-2024-0064804, filed on May 17, 2024, in the Korean Intellectual Property Office, the entire disclosure of which is incorporated herein by reference.

BACKGROUND

1. Field

Aspects of one or more embodiments relate to a display apparatus.

2. Description of the Related Art

Generally, according to the development of display apparatuses visually displaying electrical signals, various display apparatuses having excellent characteristics, such as a relatively reduced thickness, relatively light weight, and relatively low power consumption, have been introduced. For example, flexible display apparatuses that can be folded or rolled into a roll shape have been introduced. Recently, research and development on display apparatuses having various structures, such as a stretchable display apparatus that can be changed into various shapes, have been actively conducted.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus that is stretchable.

When the shape of a display apparatus is changed, a distance between pixels may be changed, and the luminance or the like of the display apparatus may be changed. Aspects of one or more embodiments include a display apparatus with relatively improved display quality. However, these characteristics are only examples, and the scope of embodiments according to the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a display layer including a display area in which a plurality of pixels are arranged and a non-display area outside the display area, a strain sensor layer including first sensing lines extending in a first direction in the display area and second sensing lines extending in a second direction intersecting the first direction in the display area, a display driving unit configured to provide image data to the plurality of pixels, and a stretch compensation unit configured to divide the display area into a plurality of sub-areas respectively including intersection areas where the first sensing lines and the second sensing lines intersect with each other, generate comparison data obtained by comparing a measurement voltage value with a reference voltage value for each of the first sensing lines and the second sensing lines, and generate stretch compensation data correcting the image data in a unit of sub-areas based on the comparison data.

According to some embodiments, when k first sensing lines (where k is a natural number greater than or equal to 2) are provided, and l second sensing lines (where l is a natural number greater than or equal to 2) are provided, the plurality of sub-areas may include k×l sub-areas.

According to some embodiments, the stretch compensation unit may include a memory storing a plurality of look-up tables and reference voltage information including a reference voltage value of each of the first sensing lines and the second sensing lines, a voltage supply circuit configured to provide a reference voltage of each of the first sensing lines and the second sensing lines and a sensor driving voltage, a comparator configured to compare a measurement voltage with a reference voltage for each of the first sensing lines and the second sensing lines to output a first value when the measurement voltage is less than or equal to the reference voltage and output a second value when the measurement voltage is greater than the reference voltage, and a compensation controller configured to generate the comparison data based on output values of the comparator, select a look-up table corresponding to the comparison data from among the plurality of look-up tables, and generate stretch compensation data based on the selected look-up table.

According to some embodiments, the compensation controller may be further configured to receive the reference voltage information and the measurement voltage value of each of the first sensing lines and the second sensing lines and determine a compensation strength in the unit of sub-areas based on a difference between the measurement voltage value and an initial voltage value for each of the first sensing lines and the second sensing lines, and the stretch compensation data may include the compensation strength in the unit of sub-areas.

According to some embodiments, the memory may further store first sensing data comprising a measurement voltage of each of the first sensing lines and the second sensing lines at a first time point and stores second sensing data including a measurement voltage of each of the first sensing lines and the second sensing lines at a second time point at which a certain time has elapsed from the first time point, the compensation controller may be further configured to calculate a stretching speed in the unit of sub-areas by comparing the first sensing data with the second sensing data and determine a compensation time point or a compensation speed based on the stretching speed, and the stretch compensation data may include the compensation time point or the compensation speed.

According to some embodiments, each of the plurality of look-up tables may include stretch compensation values in the unit of sub-areas, and stretch compensation values corresponding to boundary areas between the plurality of sub-areas among the stretch compensation values may have interpolated values.

According to some embodiments, when the comparator outputs the first value for a first-1 sensing line of the first sensing lines, the compensation controller may determine that at least one of sub-areas through which the first-1 sensing line passes is stretched in the first direction.

According to some embodiments, when the comparator outputs the first value for a second-1 sensing line of the second sensing lines, the compensation controller may determine that at least one of sub-areas through which the second-1 sensing line passes is stretched in the second direction.

According to some embodiments, when the comparator outputs the first value for a first-1 sensing line of the first sensing lines and a second-1 sensing line of the second sensing lines, the compensation controller may determine that a sub-area where the first-1 sensing line and the second-1 sensing line intersect with each other is stretched in the first direction and the second direction.

According to some embodiments, when the comparator outputs the first value for a first-1 sensing line of the first sensing lines and a second-1 sensing line of the second sensing lines, the compensation controller may determine that a sub-area where the first-1 sensing line and the second-1 sensing line intersect with each other is stretched in a third direction crossing the first direction and the second direction.

According to some embodiments, the compensation controller may be further configured to determine a stretching stage for each of the plurality of sub-areas based on the comparison data, and the voltage supply circuit may be further configured to differently supply reference voltages of each of the first sensing lines and the second sensing lines for each stretching stage.

According to some embodiments, the compensation controller may be further configured to generate different pieces of the stretch compensation data according to the stretching stage.

According to some embodiments, the stretching stage may include a first stretching stage and a second stretching stage, and the compensation controller may be further configured to generate stretch compensation data including compensation values that compensate for color coordinates of sub-areas at the first stretching stage and compensate for luminance of sub-areas at the second stretching stage.

According to some embodiments, the stretching stage may further include a third stretching stage, and, at the third stretching stage, the compensation controller may generate a protection control signal that controls a power voltage supplied to the plurality of pixels.

According to some embodiments, the display apparatus may further include an encapsulation layer on the display layer, wherein the strain sensor layer may be on the encapsulation layer.

According to some embodiments, the display apparatus may further include a substrate including a first surface on which the display layer is located, and a second surface facing the first surface, and the strain sensor layer may be on the second surface of the substrate.

According to some embodiments, the display apparatus may further include a substrate on which the display layer is located, and the strain sensor layer may be arranged between the substrate and the display layer.

According to some embodiments, each of the second sensing lines may include a pair of first sub-sensing line and second sub-sensing, the first sub-sensing line and the second sub-sensing line crossing the display area and being connected to each other in the non-display area, and the pair of first sub-sensing line and second sub-sensing line may be arranged adjacent to each other.

According to some embodiments, each of the second sensing lines may include a first portion crossing the display area and a second portion bypassing the display area and extending along the non-display area.

According to some embodiments, each of the first sensing lines and the second sensing lines may have a curved shape at the intersection areas.

Other aspects, features, and characteristics other than those described above will now become more apparent from the following drawings, claims, and the detailed description of embodiments according to the present disclosure.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 18A is a diagram for describing sensing data according to some embodiments;

FIG. 18B is a diagram for describing comparison data according to some embodiments;

DETAILED DESCRIPTION

Figure 1:
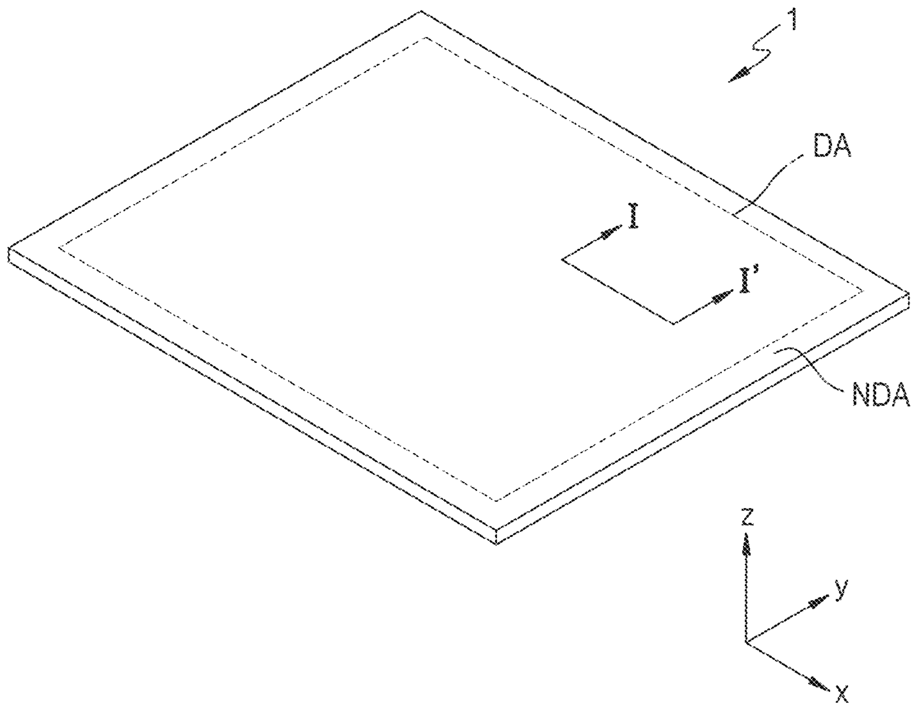
FIG. 1 is a perspective view schematically illustrating a display apparatus according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will not be repeated.

In the disclosure, while such terms as "first," "second," etc., may be used to describe various elements, such elements must not be limited to the above terms.

In the disclosure, an expression used in the singular encompasses the expression of the plural, unless it has a clearly different meaning in the context.

In the disclosure, it is to be understood that the terms such as "including" and "having" are intended to indicate the existence of the features, or elements disclosed in the present disclosure, and are not intended to preclude the possibility that one or more other features or elements may exist or may be added.

In the disclosure, it will be understood that when a layer, region, or component is referred to as being formed on another layer, region, or component, it can be directly or indirectly formed on the other layer, region, or component. That is, for example, intervening layers, regions, or components may be present.

In the disclosure, it will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

In the disclosure, "A and/or B" may include "A," "B," or "A and B." In addition, "at least one of A and B" or "at least one selected from A and B" may include "A," "B," or "A and B."

In the disclosure, the x direction, the y direction, and the z direction are not limited to three axes on the orthogonal coordinates system, and may be interpreted in a broad sense including the same. For example, the x direction, the y direction, and the z direction may be perpendicular to one another, or may represent different directions that are not perpendicular to one another.

In the disclosure, when it is referred to as "in a plan view," it means when a target portion is viewed from above (for example, when viewed from a direction perpendicular to the upper surface of a substrate), and when it is referred to as "in a cross-sectional view," it means when the vertical cross section of a target portion is viewed from the side.

In the disclosure, a first component "overlapping" a second component means that the first component is positioned above or below the second component to be at least partially overlapped in a plan view.

In the disclosure, when a certain embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. In other words, because sizes and thicknesses of components in the drawings are arbitrarily illustrated for convenience of explanation, the following embodiments are not limited thereto.

Figure 2A:
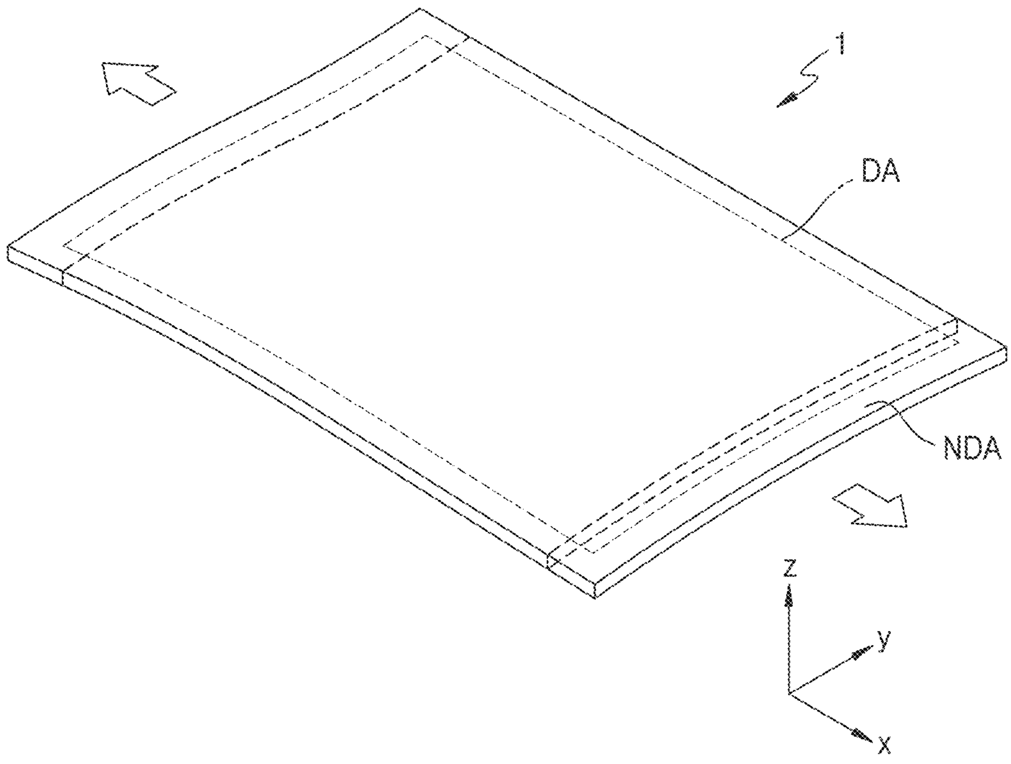
FIGS. 2A and 2B are perspective views each illustrating a state in which the display apparatus of FIG. 1 is stretched in a first direction.
Figure 2B:
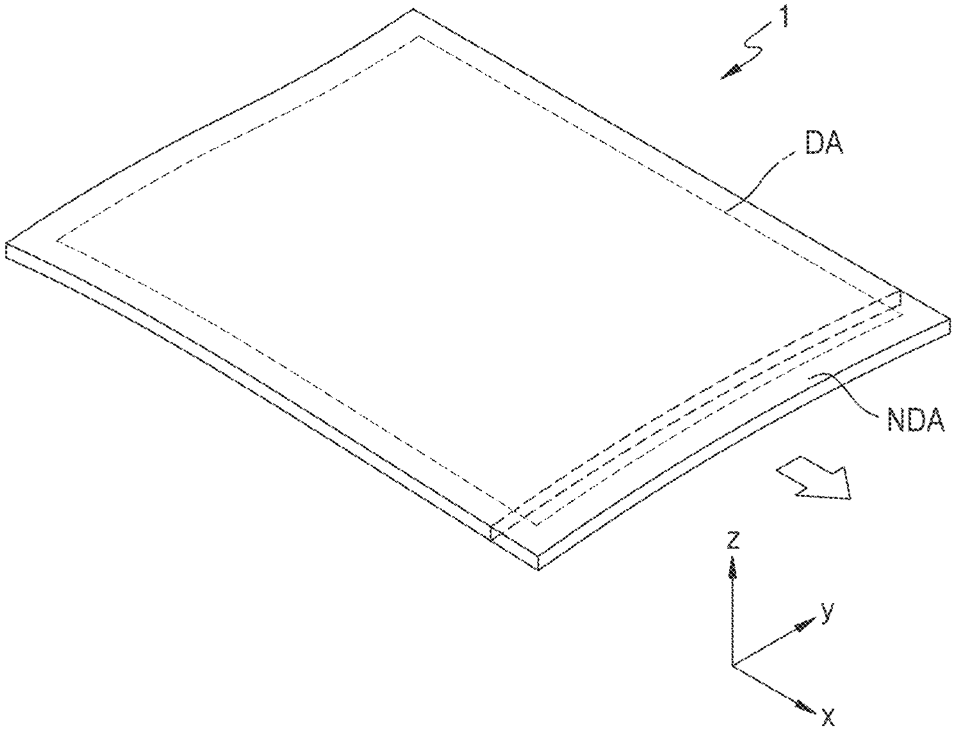
Figure 2C:
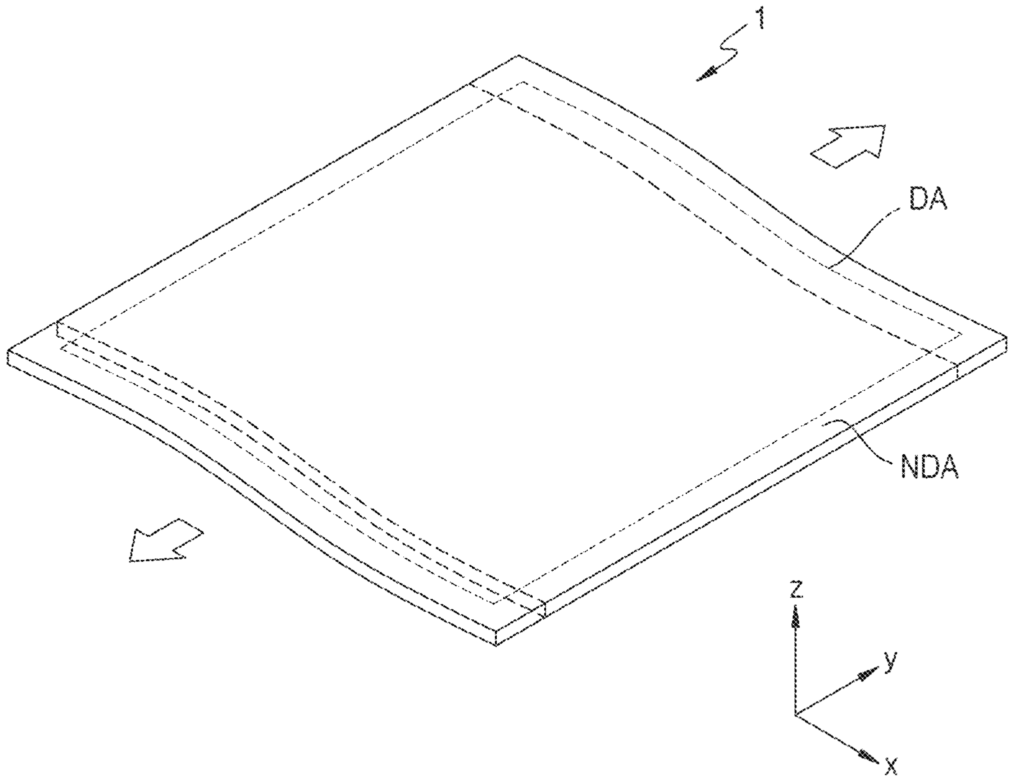
FIG. 2C is a perspective view illustrating a state in which the display apparatus of FIG. 1 is stretched in a second direction.
Figure 2D:
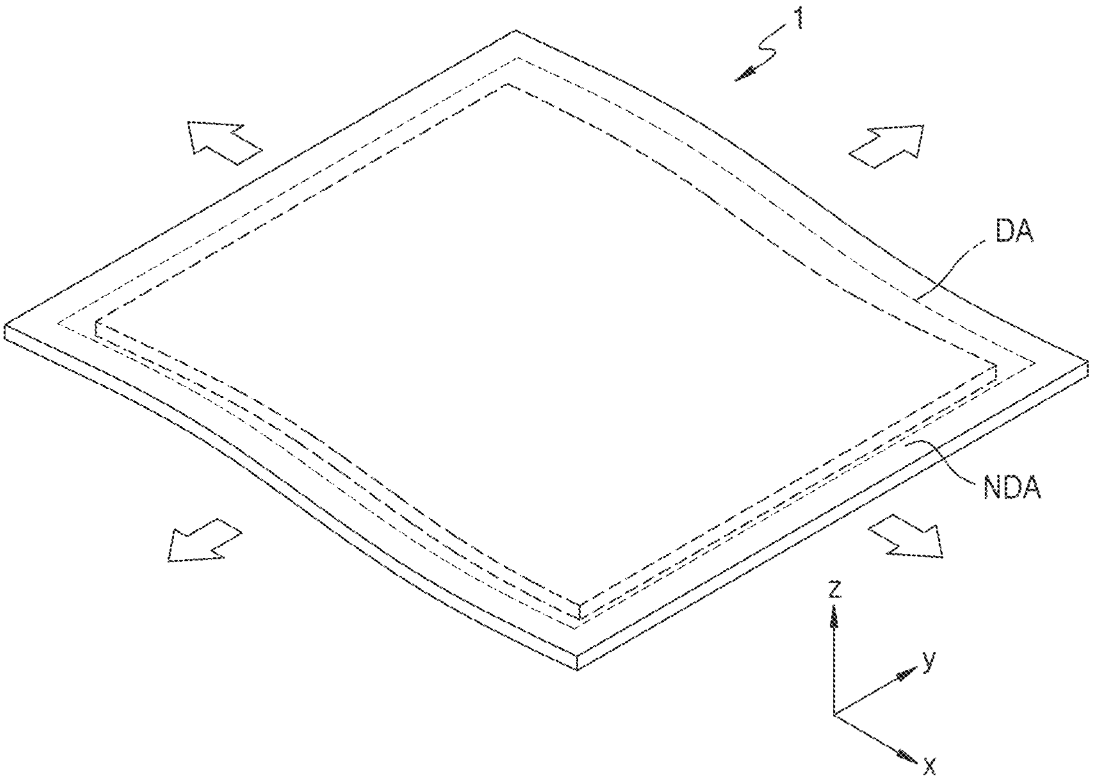
FIG. 2D is a perspective view illustrating a state in which the display apparatus of FIG. 1 is stretched in the first direction and the second direction.
Figure 2E:
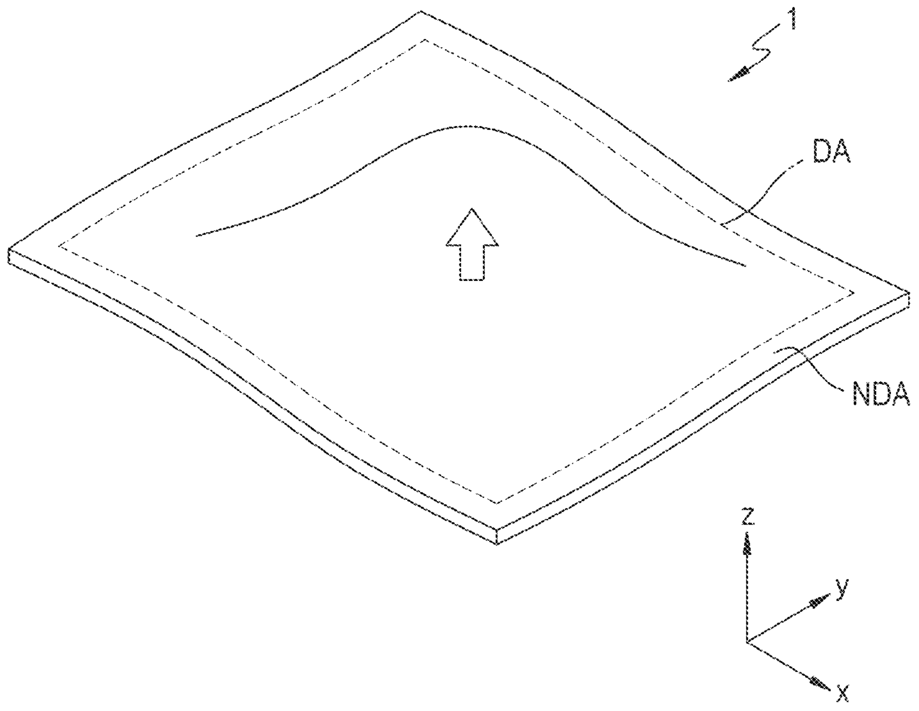
FIG. 2E is a perspective view illustrating a state in which the display apparatus of FIG. 1 is stretched in a third direction.

FIG. 1 is a schematic perspective view of a display apparatus according to some embodiments. FIGS. 2A and 2B are perspective views each illustrating a state in which the display apparatus of FIG. 1 is stretched in a first direction. FIG. 2C is a perspective view illustrating a state in which the display apparatus of FIG. 1 is stretched in a second direction. FIG. 2D is a perspective view illustrating a state in which the display apparatus of FIG. 1 is stretched in the first direction and the second direction. FIG. 2E is a perspective view illustrating a state in which the display apparatus of FIG. 1 is stretched in a third direction.

Referring to FIG. 1, a display apparatus 1 may be a stretchable display apparatus that may be stretched or shrunk in various directions. The display apparatus may include a display area DA and a non-display area NDA. The display area DA may include a plurality of pixels. The display apparatus 1 may provide an image by using light emitted by the plurality of pixels. The non-display area NDA may be arranged outside the display area DA and may be referred to as a peripheral area. The non-display area NDA may entirely surround the display area DA.

The display apparatus 1 may be stretched in a first direction (e.g., an x direction and/or an −x direction) by an external force applied by an external object or a user. According to some embodiments, as shown in FIGS. 2A and 2B, the display area DA and/or the non-display area NDA of the display apparatus 1 may be stretched in the first direction (e.g., the x direction and/or the −x direction). For example, as shown in FIG. 2A, the display apparatus 1 may be stretched in the x direction and the −x direction or may be stretched in the x direction and the −x direction in a state in which one side of the display apparatus 1 is fixed. FIG. 2B illustrates an example in which the display apparatus 1 is stretched in the x direction while one side of the display apparatus 1 is fixed.

The display apparatus 1 may be stretched in a second direction (e.g., a y direction and/or a −y direction) by an external force applied by an external object or a user. According to some embodiments, as shown in FIG. 2C, the display area DA and/or the non-display area NDA of the display apparatus 1 may be stretched in the y direction and the −y direction. According to some embodiments, the display apparatus 1 may be stretched in the y direction or the −y direction in a state in which one side of the display apparatus 1 is fixed.

The display apparatus 1 may be stretched in a plurality of directions, for example, the first direction (e.g., the x direction and/or the −x direction) and the second direction (e.g., the y direction and/or the −y direction), by an external force applied by an external object or a part of a human's body. As shown in FIG. 2D, the display area DA and/or the non-display area NDA of the display apparatus 1 may be stretched in the ±x direction and the ±y direction.

The display apparatus 1 may be stretched in a third direction (e.g., a z direction or an −z direction) by an external force applied by an external object or a part of a human's body. According to some embodiments, FIG. 2E illustrates that a portion of the display apparatus 1, for example, a partial area of the display area DA, protrudes in the z direction. According to some embodiments, a portion of the display apparatus 1, for example, a partial area of the display area DA, may protrude in the −z direction (or may be depressed in the z direction).

FIGS. 2A to 2E show that the display apparatus 1 is stretched in the first direction, the second direction, and/or the third direction, but the disclosure is not limited thereto. According to some embodiments, the display apparatus 1 may be variously modified into irregular shapes, such as having two or more axes and being bent or twisted. According to some embodiments, the display apparatus 1 may be a foldable display apparatus that is folded and unfolded around a folding axis extending in one direction, or may be a rollable display apparatus that may be rolled or unrolled around a virtual axis.

Figure 3:
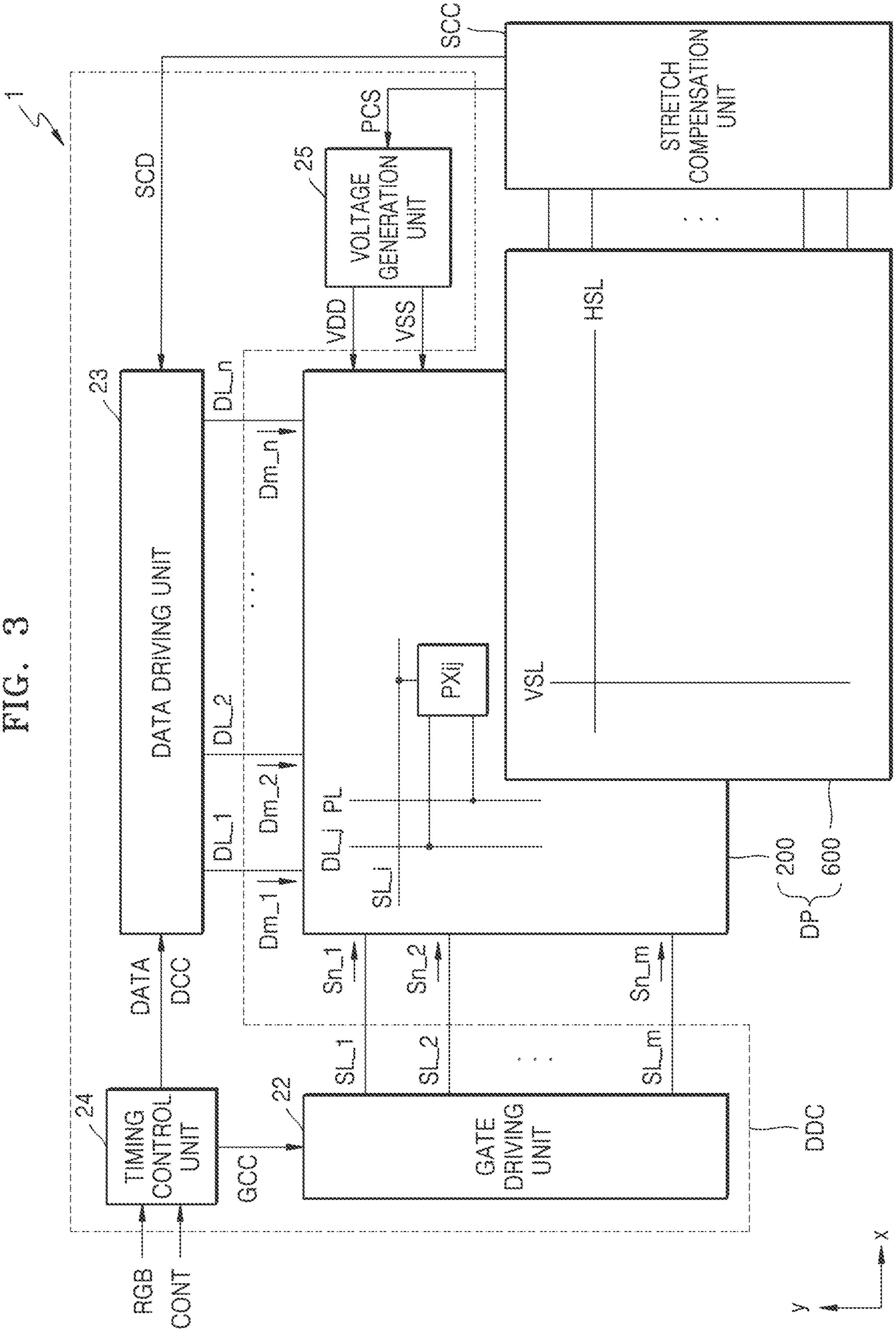
FIG. 3 is a diagram schematically illustrating a display apparatus according to some embodiments.

FIG. 3 is a diagram schematically illustrating a display apparatus according to some embodiments.

Referring to FIG. 3, the display apparatus 1 may include a display panel DP, a display driving unit DDC, and a stretch compensation unit SCC. The display panel DP may include a display layer 200 and a strain sensor layer 600.

The display layer 200 may include pixels PX, scan lines SL_1 to SL_m, data lines DL_1 to DL_n, and power lines PL, which are connected to the pixels PX. For easy understanding, FIG. 3 only shows one pixel PXij located at an i-th row and a j-th column, but m×n pixels PX may be arranged, for example, in a matrix form. Here, i is a natural number of 1 or more and m or less, and j is a natural number of 1 or more and n or less.

In FIG. 3, for illustrative purpose, a pixel PX employing a pixel driving circuit including two transistors and one capacitor is mainly described. However, the disclosure is not only applied to the pixel PX employing such a particular pixel driving circuit, and may also be equally applied to other pixel driving circuits, for example, a pixel PX employing a pixel driving circuit including three transistors and one capacitor, a pixel PX employing a pixel driving circuit including seven transistors and one capacitor, or the like.

The pixels PX are connected to the scan lines SL_1 to SL_m, the data lines DL_1 to DL_n, and the power line PL. For example, the pixel PXij located at the i-th row and the j-th column may be connected to a scan line SL_i, a data line DL_j, and the power line PL.

The data lines DL_1 to DL_n may extend in the second direction (y direction) and be connected to the pixels PX located in the same column. The scan lines SL_1 to SL_m may extend in the first direction (x direction) and be connected to the pixels PX located in the same row. The power lines PL may extend in the second direction (y direction) and be connected to the pixels PX located in the same column.

The display driving unit DDC may include a gate driving unit 22, a data driving unit 23, a timing control unit 24, and a voltage generation unit 25.

The scan lines SL_1 to SL_m are configured to transmit scan signals Sn_1 to Sn_m output from the gate driving unit 22 to the pixels PX in the same row, respectively. The data lines DL_1 to DL_n are configured to transmit data signals Dm_1 to Dm_n output from the data driving unit 23 to the pixels PX in the same column, respectively. The pixel PXij located at the i-th row and the j-th column receives a scan signal Sn_i and a data signal Dm_j.

The power lines PL are configured to transmit a first power voltage VDD output from the voltage generation unit 25 to the pixels PX.

The pixel PXij includes a light-emitting element and a driving transistor that controls the magnitude of a current flowing to the light-emitting element based on the data signal Dm_j. The data signal Dm_j is output from the data driving unit 23 and received by the pixel PXij through the data line DL_j. The light-emitting element may be, for example, an organic light-emitting diode. As the light-emitting element emits light with a luminance corresponding to the magnitude of a current received from a driving transistor, the pixel PXij may express a grayscale corresponding to the data signal Dm_j.

The voltage generation unit 25 may generate voltages necessary for driving the pixel PXij. For example, the voltage generation unit 25 may generate the first power voltage VDD and a second power voltage VSS. The level of the first power voltage VDD may be higher than the level of the second power voltage VSS.

The voltage generation unit 25 may generate an initialization voltage and provide the generated initialization voltage to the pixels PX. The initialization voltage may be applied to a gate of a driving transistor and/or an anode of a light-emitting element.

In addition, the voltage generation unit 25 may generate a turn-on voltage and a turn-off voltage for controlling a switching transistor of the pixel PXij and provide the generated turn-on voltage and turn-off voltage to the gate driving unit 22. When the turn-on voltage is applied to a gate of the switching transistor, the switching transistor may be turned on, and when the turn-off voltage is applied to the gate of the switching transistor, the switching transistor may be turned off. The voltage generation unit 25 may also generate gamma reference voltages and provide the generated gamma reference voltages to the data driving unit 23.

The timing control unit 24 may control the pixels PX by controlling operation timings of the gate driving unit 22 and the data driving unit 23. The pixels PX of the display layer 200 may receive a new data signal Dm for each frame period and emit light with a luminance corresponding to the data signal Dm, thereby displaying an image corresponding to image source data RGB of one frame.

The timing control unit 24 receives the image source data RGB and a display control signal CONT from the outside. The timing control unit 24 may convert the image source data RGB into image data DATA based on electrical characteristics or the like of the display layer 200. The timing control unit 24 may provide the image data DATA to the data driving unit 23.

The display control signal CONT may include a vertical synchronization signal, a horizontal synchronization signal, a data enable signal, a clock signal, or the like. The timing control unit 24 may control the operation timings of the gate driving unit 22 and the data driving unit 23 by using the display control signal CONT. The timing control unit 24 may determine a frame period by counting the data enable signals of one horizontal scanning period. The image source data RGB includes luminance information of the pixels PX. A luminance may have a set or predetermined number, for example, 1024 (=210), 256 (=28), or 64 (=26) grayscales.

The timing control unit 24 may generate control signals including a gate timing control signal GCC for controlling the operation timing of the gate driving unit 22, and a data timing control signal DCC for controlling the operation timing of the data driving unit 23.

The gate driving unit 22 sequentially generates the scan signals Sn_1 to Sn_m by using a turn-on voltage or a turn-off voltage provided from the voltage generation unit 25, in response to the gate timing control signal GCC supplied from the timing control unit 24.

The data driving unit 23 samples and latches the image data DATA provided from the timing control unit 24 in response to the data timing control signal DCC supplied from the timing control unit 24 to convert the image data DATA into data of a parallel data system. When converting the image data DATA into the data of the parallel data system, the data driving unit 23 converts the image data DATA into a gamma reference voltage to convert the same into the data signal Dm in an analog form. The data driving unit 23 provides the data signals Dm_1 to Dm_n to the pixels PX via the data lines DL_1 to DL_n. The pixels PX receive the data signals Dm_1 to Dm_n in response to the scan signals Sn_1 to Sn_m.

According to some embodiments, the display driving unit DDC may be provided in the non-display area NDA of the display apparatus 1. The gate driving unit 22, the data driving unit 23, the timing control unit 24, and the voltage generation unit 25 of the display driving unit DDC may be formed respectively in separate integrated circuit chips or a single integrated circuit chip to be located on a flexible printed circuit board (FPCB) electrically connected to a pad located on one side of a substrate.

According to some embodiments, a portion of the gate driving unit 22 or the entire gate driving unit 22 may be formed directly in the non-display area NDA of the display apparatus 1 during a process of forming a pixel driving circuit unit of the display area DA. The data driving unit 23, the timing control unit 24, and the voltage generation unit 25 may be formed respectively in separate integrated circuit chips or a single integrated circuit chip to be located on an FPCB electrically connected to a pad located on one side of a substrate. According to some embodiments, the data driving unit 23 and the timing control unit 24 may be directly located on a substrate in a chip-on-plastic (COP) method.

The strain sensor layer 600 may be arranged to overlap the display layer 200. The strain sensor layer 600 may include horizontal sensing lines HSL (first sensing lines) extending in a first direction (x direction) and vertical sensing lines VSL (second sensing lines) extending in a second direction (y direction). FIG. 3 shows only one horizontal sensing line HSL and one vertical sensing line VSL, but at least two or more of each of the horizontal sensing line HSL and vertical sensing line VSL may be arranged. For example, k horizontal sensing lines HSL (where k is a natural number greater than or equal to 2) may be provided and arranged to be spaced apart from each other in the second direction (y direction). l vertical sensing lines VSL (where l is a natural number greater than or equal to 2) may be provided and arranged to be spaced apart from each other in the first direction (x direction). The horizontal sensing lines HSL and the vertical sensing lines VSL may intersect each other in the display area DA (refer to FIG. 1) to form a mesh structure in a plan view. The electrical characteristics of the horizontal sensing lines HSL and the vertical sensing lines VSL may change depending on the stretching of the display panel DP. Changes in electrical characteristics may include changes in voltage or current in each of the horizontal sensing lines HSL and the vertical sensing lines VSL.

The stretch compensation unit SCC may measure an electrical characteristic value of each of the horizontal sensing lines HSL and the vertical sensing lines VSL, generate comparison data by comparing the measured electrical characteristic value with a reference value, and generate stretch compensation data SCD and/or protection control signal PCS based on the comparison data to transmit the generated stretch compensation data SCD and/or protection control signal PCS to the display driving unit DDC.

The comparison data may be obtained by comparing a characteristic value (e.g., a measurement voltage) with a corresponding reference value (e.g., a reference voltage) for each of the horizontal sensing lines HSL and the vertical sensing lines VSL and selecting one of two values with respect to each of the horizontal sensing lines HSL and the vertical sensing lines VSL. For example, when a characteristic value of any one of the horizontal sensing lines HSL and the vertical sensing lines VSL is less than or equal to a reference value, the comparison data may have a first value (e.g., a low-level voltage) for the corresponding sensing line. When a characteristic value of any one of the horizontal sensing lines HSL and the vertical sensing lines VSL is greater than a reference value, the comparison data may have a second value (e.g., a high-level voltage) for the corresponding sensing line.

The stretch compensation unit SCC may divide the display area DA into a plurality of sub-areas and generate the stretch compensation data SCD that compensates for the image data DATA in units of sub-areas based on the comparison data. Compensating for the image data DATA in the units of sub-areas means selecting a sub-area that needs compensation due to stretching and changing data signals of pixels included in the selected sub-area based on the image data DATA and the stretch compensation data SCD to compensate for the luminance and/or color coordinates of the pixels included in the selected sub-area. The stretch compensation unit SCC may select, from among a plurality of look-up tables previously stored in a memory, a look-up table corresponding to the comparison data and generate the stretch compensation data SCD based on the selected look-up table. According to some embodiments, the look-up table may include gamma compensation values.

According to some embodiments, the stretch compensation unit SCC may determine a stretching stage for each of sub-areas based on the comparison data and generate different pieces of stretch compensation data SCD according to the stretching stage. For example, in a first stretching stage, the stretch compensation data SCD may include compensation values for compensating color coordinates of stretched sub-areas. In a second stretching stage, the stretch compensation data SCD may include compensation values for compensating the luminance of stretched sub-areas of the image data DATA. In a third stretching stage, the stretch compensation unit SCC may generate the protection control signal PCS for controlling the first power voltage VDD and/or the second power voltage VSS. In a fourth stretching stage, the stretch compensation unit SCC may generate a mechanical unit control signal for controlling an operation of a stretching mechanical unit that makes the display apparatus 1 stretched. Such stage-by-stage operations of the stretch compensation unit SCC are examples, and the disclosure is not limited thereto. For example, some stages may be omitted or added, and two or more operations may be simultaneously performed in each stage.

Figure 4A:
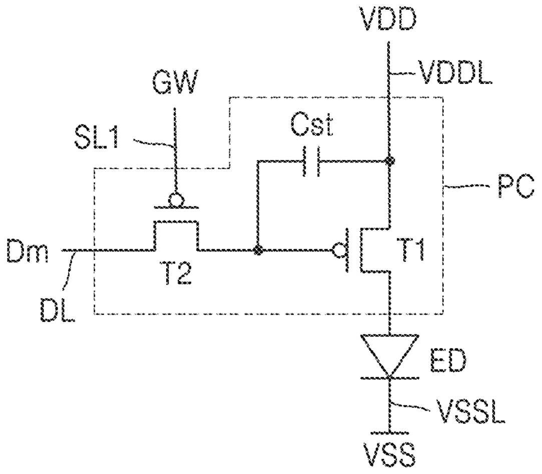
FIGS. 4A, 4B, and 4C are equivalent circuit diagrams each illustrating a pixel of a display apparatus according to some embodiments.
Figure 4B:
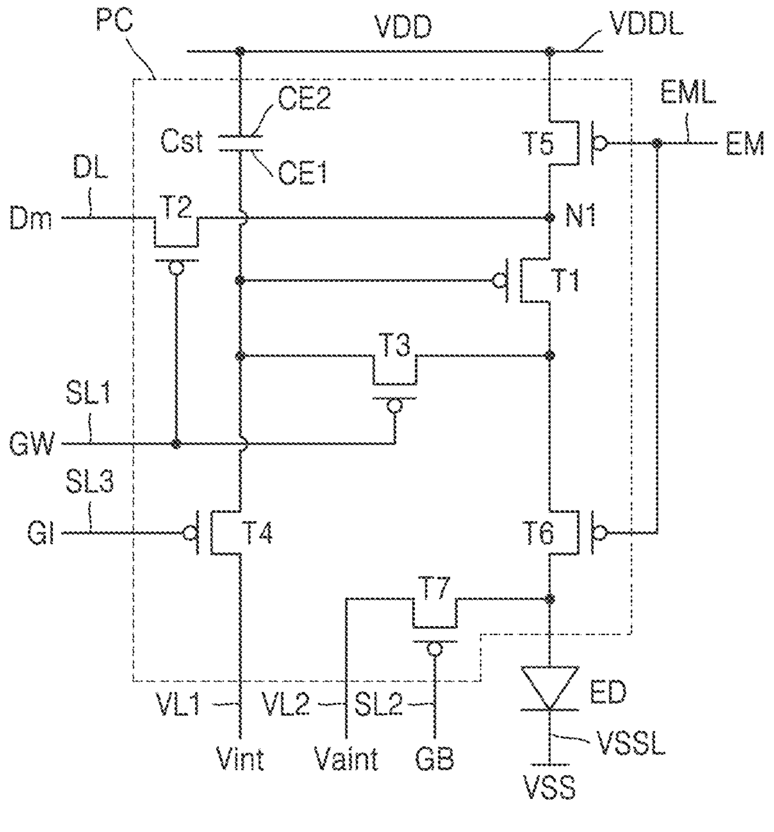
Figure 4C:
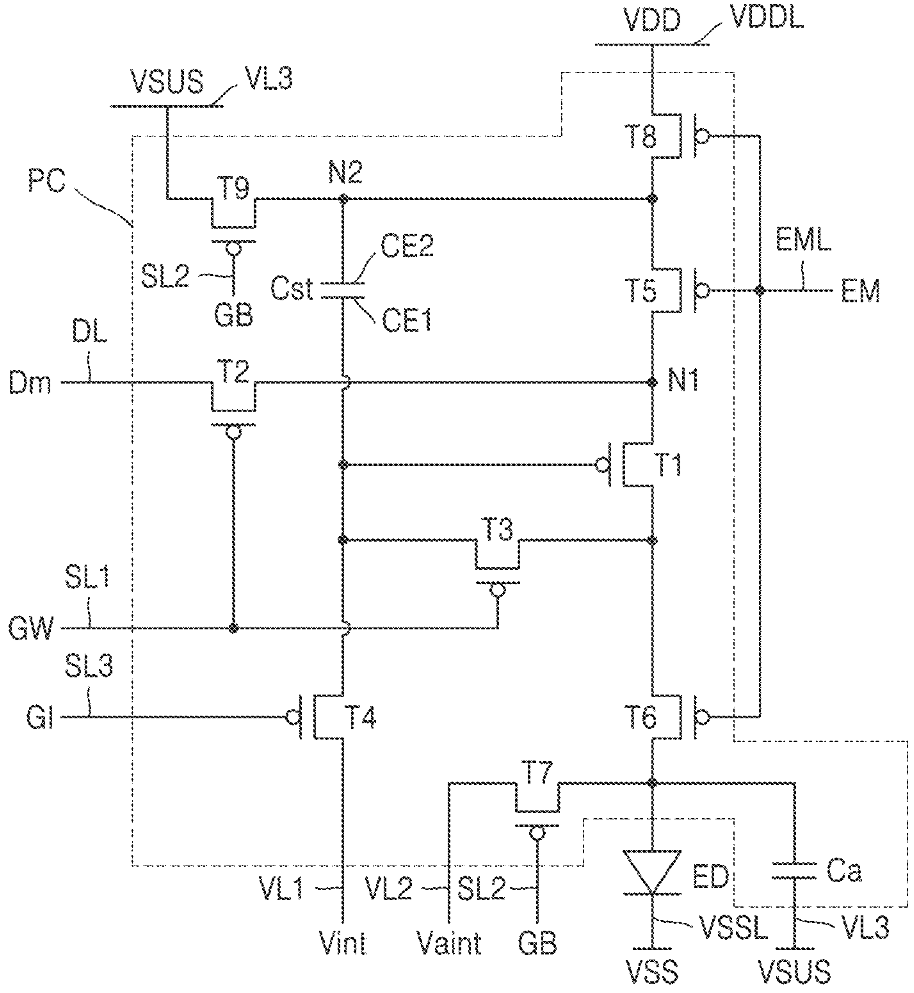

FIGS. 4A, 4B, and 4C are equivalent circuit diagrams each illustrating a pixel of a display apparatus according to some embodiments. Although FIGS. 4A-4C illustrate various components in a pixel according to some embodiments, embodiments according to the present disclosure are not limited thereto, and according to various embodiments, the pixel may include additional components or fewer components without departing from the spirit and scope of embodiments according to the present disclosure.

Referring to FIG. 4A, the pixel PX (refer to FIG. 3) may include a light-emitting element ED and a pixel driving circuit unit PC electrically connected to the light-emitting element ED. The pixel driving circuit unit PC may include a first transistor T1, a second transistor T2, and a storage capacitor Cst. The pixel driving circuit unit PC may be electrically connected to signal lines and voltage lines. The signal lines may include a gate line, such as a first scan line SL1, and a data line DL, and the voltage lines may include a first voltage line (driving power voltage line) VDDL. The first voltage line VDDL may have a configuration corresponding to the power line PL shown in FIG. 3.

The second transistor T2 may be electrically connected to the first scan line SL1 and the data line DL. The first scan line SL1 may provide a first scan signal GW to a gate electrode of the second transistor T2. The second transistor T2 may be a switching transistor that is turned on or turned off in response to the first scan signal GW input from the first scan line SL1. The second transistor T2 may be electrically connected to the first transistor T1 to transmit the data signal Dm input from the data line DL to the first transistor T1.

The storage capacitor Cst may be electrically connected to the second transistor T2 and the first voltage line VDDL and store a voltage corresponding to the difference between a voltage received from the second transistor T2 and the first power voltage VDD supplied by the first voltage line VDDL.

The first transistor T1 is a driving transistor and may control a driving current flowing through the light-emitting element ED. The first transistor T1 may be connected to the first voltage line VDDL and the storage capacitor Cst. The first transistor T1 may control the driving current flowing through the light-emitting element ED from the first voltage line VDDL in accordance with a voltage value stored in the storage capacitor Cst. The light-emitting element ED may emit light having a certain luminance according to the driving current. A first electrode (anode) of the light-emitting element ED may be electrically connected to the first transistor T1, and a second electrode (cathode) thereof may be electrically connected to a second voltage line VSSL supplying a second power voltage (common power voltage) VSS.

FIG. 4A shows that the pixel driving circuit unit PC includes two transistors and one storage capacitor, but according to some embodiments, the pixel driving circuit unit PC may include three or more transistors.

Referring to FIG. 4B, the pixel driving circuit unit PC may include a first transistor T1, a second transistor T2, a third transistor T3, a fourth transistor T4, a fifth transistor T5, a sixth transistor T6, a seventh transistor T7, and a storage capacitor Cst. The pixel driving circuit unit PC is electrically connected to signal lines and voltage lines. The signal lines may include gate lines, such as a first scan line SL1, a second scan line SL2, a third scan line SL3, and an emission control line EML, and a data line DL. The voltage lines may include a first initialization voltage line VL1, a second initialization voltage line VL2, and a first voltage line VDDL.

The first voltage line VDDL may transmit the first power voltage VDD to the first transistor T1. The first initialization voltage line VL1 may transmit a first initialization voltage Vint that initializes the first transistor T1 to the pixel driving circuit unit PC. The second initialization voltage line VL2 may transmit a second initialization voltage Vaint that initializes the first electrode of the light-emitting element ED to the pixel driving circuit unit PC.

The first transistor T1 may be electrically connected to the first voltage line VDDL via the fifth transistor T5 and may be electrically connected to the light-emitting element ED via the sixth transistor T6. The first transistor T1 serves as a driving transistor and receives the data signal Dm according to a switching operation of the second transistor T2 to supply a driving current to the light-emitting element ED.

The second to seventh transistor T2 to T7 may be switching transistors that are turned on or turned off according to a gate-source voltage or a gate voltage.

The second transistor T2 is a data write transistor, which is electrically connected to the first scan line SL1 and the data line DL. The second transistor T2 is electrically connected to the first voltage line VDDL via the fifth transistor T5. The second transistor T2 is turned on in response to the first scan signal GW received through the first scan line SL1 to perform a switching operation of transmitting the data signal Dm transmitted through the data line DL to a first node N1.

The third transistor T3 is electrically connected to the first scan line SL1 and is electrically connected to the light-emitting element ED via the sixth transistor T6. The third transistor T3 may be turned on in response to the first scan signal GW received through the first scan line SL1 to diode-connect the first transistor T1.

The fourth transistor T4 is a first initialization transistor, which is electrically connected to the third scan line SL3 and the first initialization voltage line VL1. The fourth transistor T4 is turned on in response to a third scan signal GI received through the third scan line SL3 to transmit the first initialization voltage Vint from the first initialization voltage line VL1 to a gate electrode of the first transistor T1 to initialize the voltage of the gate electrode of the first transistor T1. The third scan signal GI may correspond to a first scan signal from another pixel driving circuit unit arranged in a previous row of the corresponding pixel driving circuit unit PC.

The fifth transistor T5 may be an operation control transistor, and the sixth transistor T6 may be an emission control transistor. The fifth transistor T5 and the sixth transistor T6 are electrically connected to the emission control line EML and are simultaneously turned on in response to an emission control signal EM received through the emission control line EML to form a current path so that a driving current may flow in a direction from the first voltage line VDDL to the light-emitting element ED.

The seventh transistor T7 is a second initialization transistor, which may be electrically connected to the second scan line SL2, the second initialization voltage line VL2, and the sixth transistor T6. The seventh transistor T7 may be turned on in response to a second scan signal GB received through the second scan line SL2 and may transmit the second initialization voltage Vaint from the second initialization voltage line VL2 to the first electrode of the light-emitting element ED to initialize the first electrode of the light-emitting element ED.

The storage capacitor Cst includes a first capacitor electrode CE1 and a second capacitor electrode CE2. The first capacitor electrode CE1 is electrically connected to the gate electrode of the first transistor T1, and the second capacitor electrode CE2 is electrically connected to the first voltage line VDDL. The storage capacitor Cst may maintain a voltage applied to the gate electrode of the first transistor T1 by storing and maintaining the difference between voltages of both ends of the first voltage line VDDL and the gate electrode of the first transistor T1.

Referring to FIG. 4C, the pixel driving circuit unit PC may include a first transistor T1, a second transistor T2, a third transistor T3, a fourth transistor T4, a fifth transistor T5, a sixth transistor T6, a seventh transistor T7, an eighth transistor T8, a ninth transistor T9, a storage capacitor Cst, and an auxiliary capacitor Ca.

The pixel driving circuit unit PC is electrically connected to signal lines and voltage lines. The signal lines may include gate lines, such as a first scan line SL1, a second scan line SL2, a third scan line SL3, and an emission control line EML, and a data line DL. The voltage lines may include first and second initialization voltage lines VL1 and VL2, a maintenance voltage line VL3, and a first voltage line VDDL.

The first voltage line VDDL may transmit the first power voltage VDD to the first transistor T1. The first initialization voltage line VL1 may transmit a first initialization voltage Vint that initializes the first transistor T1 to the pixel driving circuit unit PC. The second initialization voltage line VL2 may transmit a second initialization voltage Vaint that initializes the first electrode of the light-emitting element ED to the pixel driving circuit unit PC. The maintenance voltage line VL3 may provide a maintenance voltage VSUS to a second node N2, for example, the second capacitor electrode CE2 of the storage capacitor Cst, during an initialization section and a data write section.

The first transistor T1 may be electrically connected to the first voltage line VDDL via the fifth transistor T5 and the eighth transistor T8, and may be electrically connected to the light-emitting element ED via the sixth transistor T6. The first transistor T1 may serve as a driving transistor and receive the data signal Dm according to a switching operation of the second transistor T2 to supply a driving current to the light-emitting element ED.

The second to ninth transistors T2 to T9 may be switching transistors that are turned on or turned off according to a gate-source voltage or a gate voltage.

The second transistor T2 is electrically connected to the first scan line SL1 and the data line DL and is electrically connected to the first voltage line VDDL via the fifth transistor T5 and the eighth transistor T8. The second transistor T2 is turned on in response to the first scan signal GW received through the first scan line SL1 to perform a switching operation of transmitting the data signal Dm transmitted through the data line DL to a first node N1.

The third transistor T3 is electrically connected to the first scan line SL1 and is electrically connected to the light-emitting element ED via the sixth transistor T6. The third transistor T3 may be turned on in response to the first scan signal GW received through the first scan line SL1 to diode-connect the first transistor T1, thereby compensating for a threshold voltage of the first transistor T1.

The fourth transistor T4 is electrically connected to the third scan line SL3 and the first initialization voltage line VL1 and turned on in response to the third scan signal GI received through the third scan line SL3 to transmit the first initialization voltage Vint from the first initialization voltage line VL1 to the gate electrode of the first transistor T1 to initialize the voltage of the gate electrode of the first transistor T1. The third scan signal GI may correspond to a first scan signal from another pixel driving circuit unit arranged in a previous row of the corresponding pixel driving circuit unit PC.

The fifth transistor T5, the sixth transistor T6, and the eighth transistor T8 are electrically connected to the emission control line EML and simultaneously turned on in response to the emission control signal EM received through the emission control line EML to form a current path so that the driving current may flow in a direction from the first voltage line VDDL to the light-emitting element ED.

The seventh transistor T7 is a second initialization transistor, which may be electrically connected to the second scan line SL2, the second initialization voltage line VL2, and the sixth transistor T6. The seventh transistor T7 is turned on in response to the second scan signal GB received through the second scan line SL2 to transmit the second initialization voltage Vaint from the second initialization voltage line VL2 to the first electrode of the light-emitting element ED to initialize the first electrode of the light-emitting element ED.

The ninth transistor T9 may be electrically connected to the second scan line SL2, the second capacitor electrode CE2 of the storage capacitor Cst, and the maintenance voltage line VL3. The ninth transistor T9 may be turned on in response to the second scan signal GB received through the second scan line SL2 and transmit the maintenance voltage VSUS to the second node N2, for example, the second capacitor electrode CE2 of the storage capacitor Cst, during an initialization section and a data write section.

The eighth transistor T8 and the ninth transistor T9 may each be electrically connected to the second node N2, for example, the second capacitor electrode CE2 of the storage capacitor Cst. In some embodiments, the eighth transistor T8 may be turned off and the ninth transistor T9 may be turned on during the initialization section and the data write section, and the eighth transistor T8 may be turned on and the ninth transistor T9 may be turned off during an emission section. Because the maintenance voltage VSUS is transmitted to the second node N2 during the initialization section and the data write section, the luminance uniformity (for example, longrange uniformity (LRU)) of a display apparatus according to a voltage drop of the first voltage line VDDL may be relatively improved.

The storage capacitor Cst includes the first capacitor electrode CE1 and the second capacitor electrode CE2. The first capacitor electrode CE1 is electrically connected to the gate electrode of the first transistor T1, and the second capacitor electrode CE2 is electrically connected to the eighth transistor T8 and the ninth transistor T9.

The auxiliary capacitor Ca may be electrically connected to the sixth transistor T6, the maintenance voltage line VL3, and the first electrode of the light-emitting element ED. The auxiliary capacitor Ca may store and maintain a voltage corresponding to a voltage difference between the first electrode of the light-emitting element ED and the maintenance voltage line VL3 while the seventh transistor T7 and the ninth transistor T9 are turned on, so that a problem in which black luminance increases when the sixth transistor T6 is turned off may be prevented or relatively reduced.

Figure 5A:
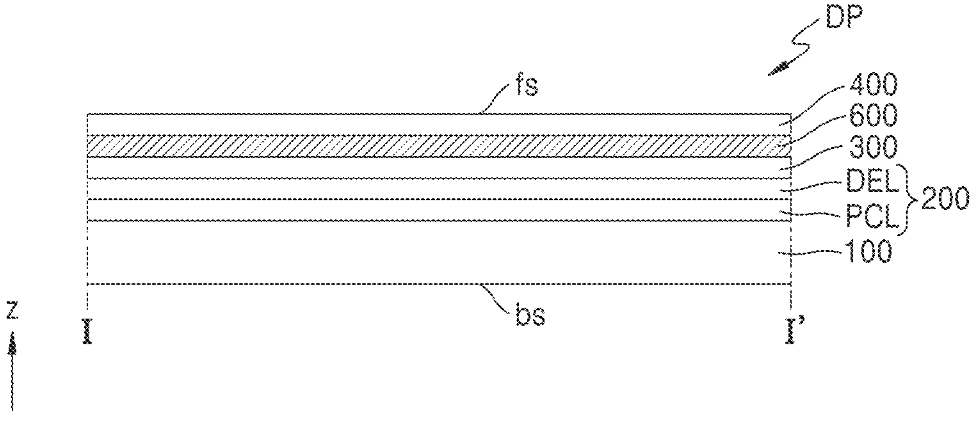
FIGS. 5A and 5B are cross-sectional views each illustrating the display apparatus shown in FIG. 1, taken along a line I-I'.
Figure 5B:
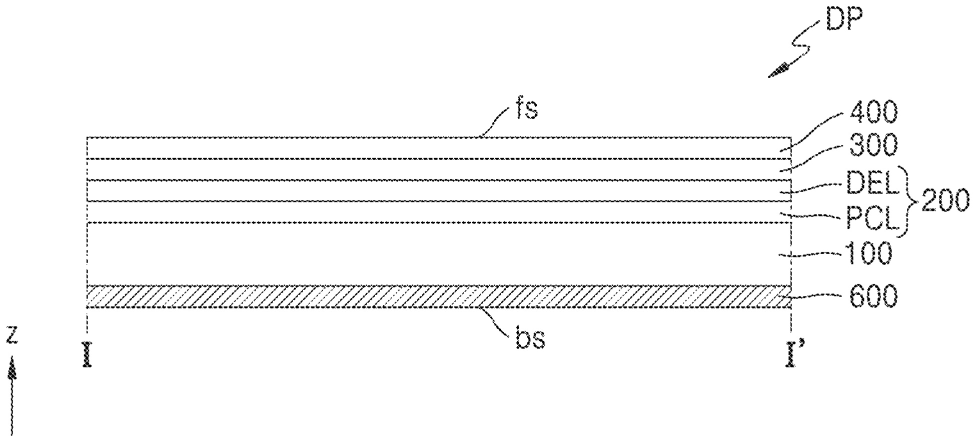

FIGS. 5A and 5B are cross-sectional views each illustrating the display apparatus shown in FIG. 1, taken along a line I-I'.

Referring to FIGS. 5A and 5B, the display apparatus 1 (refer to FIG. 1) may include a display panel DP. The display panel DP may include a first surface fs and a second surface bs facing the first surface fs. In the disclosure, in the display panel DP, when a first component is located closer to the first surface fs than a second component, it means that the first component is located on the second component, and when the second component is located closer to the second surface bs than the first component, it means that the second component is located below the first component.

The display panel DP may include a substrate 100, a display layer 200, an encapsulation layer 300, a strain sensor layer 600, and a touch sensor layer 400.

The substrate 100 may be a stretchable substrate that may be stretched or shrunk in a certain direction. The substrate 100 may include a stretchable material, for example, a stretchable polymer resin. In some embodiments, the substrate 100 may include an elastomer. The elastomer may include an organic elastomer, an organic-inorganic elastomer, or a combination thereof. For example, the substrate 100 may include a silicon-based elastomer such as polydimethylsiloxane, a styrene-based elastomer, an olefin-based elastomer, polyurethane, or a mixture thereof. The substrate 100 may have a single-layered structure or a multi-layered structure.

The display layer 200 may be located on the substrate 100. The display layer 200 may be a layer including a plurality of pixels PX (refer to FIG. 3) and display an image. The display layer 200 may include a pixel circuit layer PCL and a light-emitting element layer DEL on the pixel circuit layer PCL. The pixel circuit layer PCL may include a pixel driving circuit unit PC (refer to FIGS. 4A to 4C), signal lines electrically connected to the pixel driving circuit unit PC, and outer circuits arranged in a non-display area NDA (refer to FIG. 1). The light-emitting element layer DEL may include light-emitting elements. According to some embodiments, the light-emitting element may be a light-emitting diode.

The encapsulation layer 300 sealing the light-emitting elements may be located on the display layer 200. According to some embodiments, the encapsulation layer 300 may include a structure in which an inorganic encapsulation layer including an inorganic insulating material and an organic encapsulation layer including an organic insulating material are stacked. According to some embodiments, the encapsulation layer 300 may include an organic material such as resin, urethane epoxy acrylate, or the like. According to some embodiments, the encapsulation layer 300 may include a photosensitive material, for example, a material such as photoresist.

The strain sensor layer 600 may be located on the encapsulation layer 300. The strain sensor layer 600 may include sensing lines of which electrical characteristics change according to the stretching of the display panel DP. According to some embodiments, the stretching of the display panel DP may be sensed by measuring the voltages of the sensing lines included in the strain sensor layer 600. According to some embodiments, the stretching of the display panel DP may be sensed by measuring the voltages of the sensing lines included in the strain sensor layer 600.

According to some embodiments, the strain sensor layer 600 may be formed through a continuous process with the encapsulation layer 300. For example, the strain sensor layer 600 may be directly formed on a base surface provided by the encapsulation layer 300. According to some embodiments, the strain sensor layer 600 may be attached to the encapsulation layer 300 by using an adhesive layer or the like.

The touch sensor layer 400 may be located on the strain sensor layer 600. The touch sensor layer 400 may include touch electrodes, touch signal lines, and touch insulating layers located below and/or above the touch electrodes. The display apparatus may sense whether a user has input a touch and a touch position by measuring an amount of change in capacitance of the touch electrodes.

According to some embodiments, the touch sensor layer 400 may be formed through a continuous process with the strain sensor layer 600. For example, the touch sensor layer 400 may be directly formed on a base surface provided by the strain sensor layer 600. According to some embodiments, the touch sensor layer 400 may also be configured as a separate panel and attached to the strain sensor layer 600 by using an adhesive layer or the like.

FIG. 5A shows that the strain sensor layer 600 is arranged between the encapsulation layer 300 and the touch sensor layer 400, but the disclosure is not limited thereto. As shown in FIG. 5B, the strain sensor layer 600 may be located on the rear surface of the substrate 100, for example, the second surface bs of the display panel DP. According to some embodiments, the strain sensor layer 600 may be arranged between the substrate 100 and the display layer 200 or may be located on the touch sensor layer 400. According to some embodiments, the strain sensor layer 600 may be integrally provided with the display layer 200 or the touch sensor layer 400. For example, the sensing lines configuring a strain sensor may be arranged in some of the conductive layers included in the display layer 200 or the touch sensor layer 400.

Figure 6A:
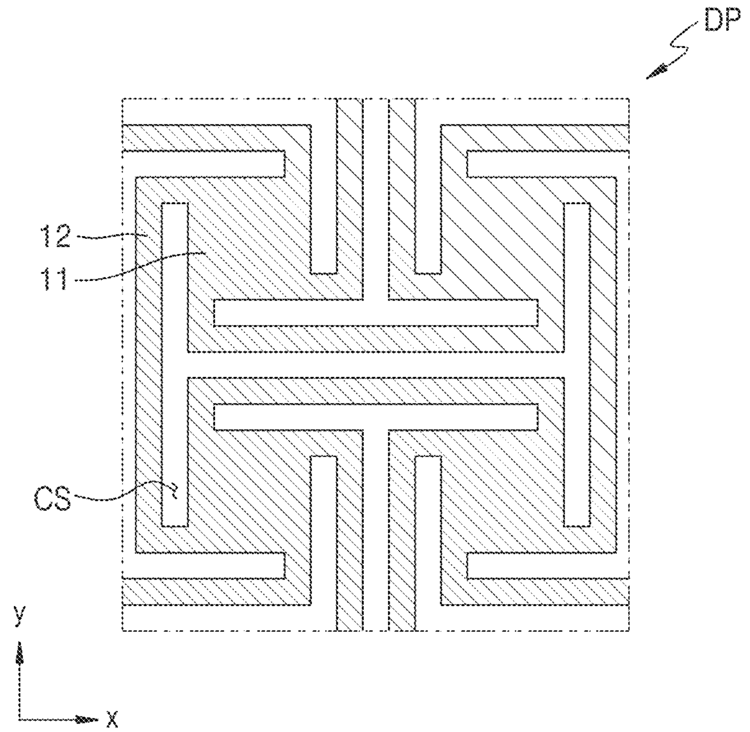
FIGS. 6A and 6B are plan views each schematically illustrating a portion of a display panel according to some embodiments.
Figure 6B:
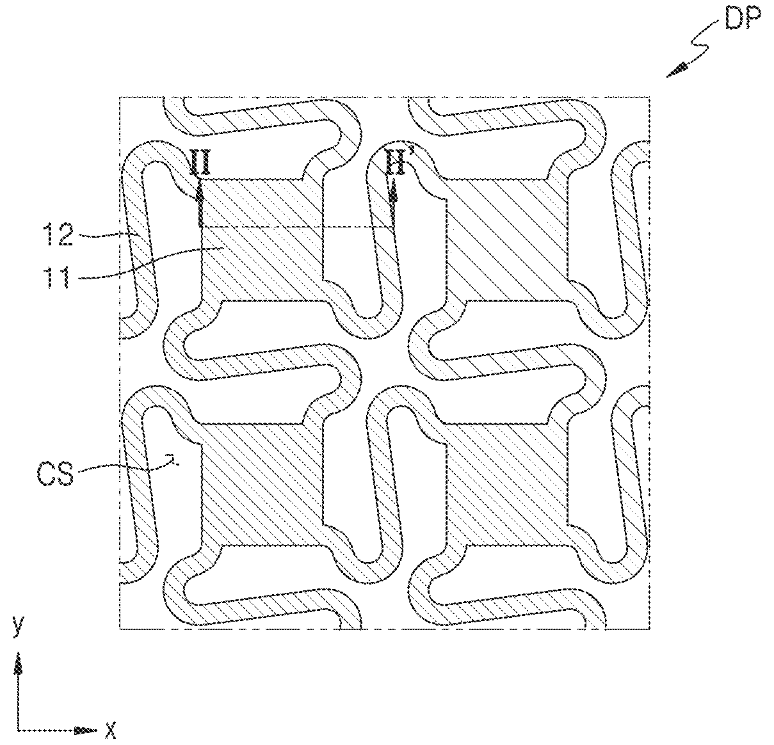
Figure 6C:
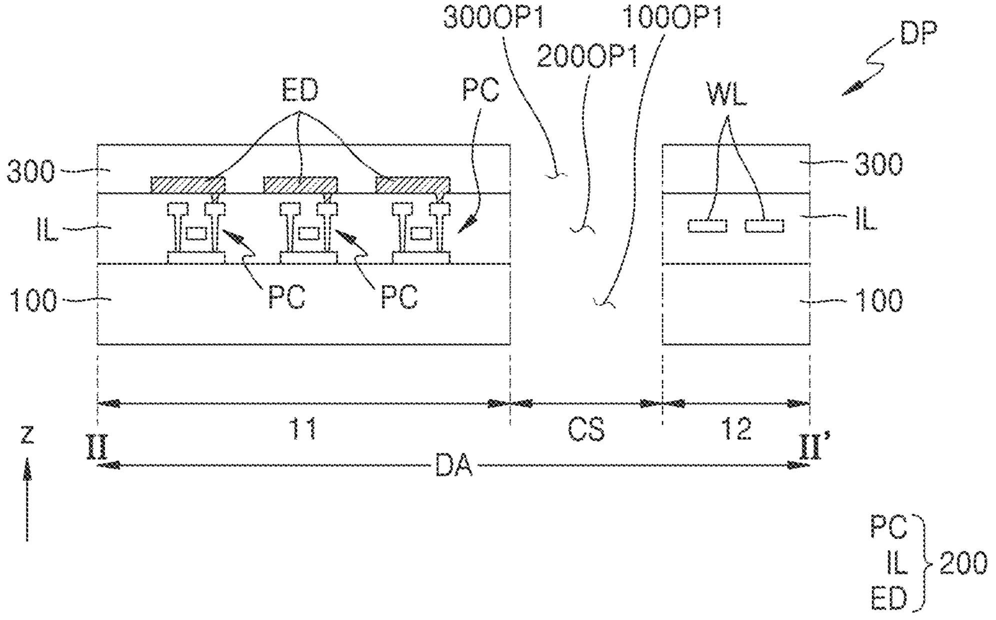
FIG. 6C is a cross-sectional view schematically illustrating the display panel shown in FIG. 6B, taken along a line II-II'.

FIGS. 6A and 6B are plan views each schematically illustrating a portion of a display panel according to some embodiments, and FIG. 6C is a cross-sectional view schematically illustrating the display panel shown in FIG. 6B, taken along a line II-II'.

Referring to FIG. 6A, the display panel DP may include first areas 11 spaced apart from each other in a first direction (x direction) and a second direction (y direction), and second areas 12 connecting adjacent first areas 11 to each other.

A first area 11 may include at least one unit pixel. The unit pixel may be a minimum repeating unit of pixels having a certain arrangement. In some embodiments, pixels arranged in the first area 11 may be arranged in a diamond type or a Pentile® type, and one unit pixel may include one blue pixel, one red pixel, and two green pixels. According to some embodiments, pixels arranged in the first area 11 may be arranged in a stripe type, and one unit pixel may include one blue pixel, one red pixel, and one green pixel.

Each of the first areas 11 may be connected to a plurality of second areas 12. For example, each of the first areas 11 may be connected to four second areas 12. Two second areas 12 may be respectively arranged on both sides of the first area 11 in a first direction (e.g., an x direction or −x direction), and the remaining two second areas 12 may be respectively arranged on both sides of the first area 11 in a second direction (e.g., a y direction or −y direction). According to some embodiments, four second areas 12 may be respectively connected to four sides of the first area 11. Each of the four second areas 12 may be adjacent to each of the corners of the first area 11.

The second areas 12 may be spaced apart from each other by an opening portion CS positioned between the second areas 12. According to some embodiments, the opening portion CS having an approximately H shape and the first opening portion CS having an approximately I shape obtained by rotating the above-described H shape by 90 degrees may be alternately and repeatedly arranged in each of the first direction (x direction) and the second direction (y direction). Both end portions of each second area 12 are respectively connected to adjacent first areas 11, but one side of each second area 12 may be spaced apart from one side of an adjacent first area 11 and/or one side of another second area 12 by the opening portion CS.

Referring to FIG. 6B, the display panel DP may include the first areas 11 spaced apart from each other in the first direction (e.g., the x direction or −x direction) and the second direction (e.g., the y direction or −y direction), and the second areas 12 connecting adjacent first areas 11 to each other.

The second areas 12 may be spaced apart from each other by the opening portion CS positioned between the second areas 12. The second area 12 may have a serpentine shape. For example, as shown in FIG. 6B, the second area 12 may have an approximate shape of 'the letter S.'

Each first area 11 may be connected to the plurality of second areas 12. For example, each first area 11 may be connected to four second areas 12. Two second areas 12 may be respectively arranged on both sides of the first area 11 in a first direction (e.g., an x direction or −x direction), and the remaining two second areas 12 may be respectively arranged on both sides of the first area 11 in a second direction (e.g., a y direction or −y direction). Four second areas 12 may be respectively connected to four sides of the first area 11. Each of the four second areas 12 may be adjacent to each of the corners of the first area 11.

The first areas 11 and the second areas 12 of FIGS. 6A and 6B may be arranged in the display area DA (refer to FIG. 1) of the display panel DP. According to some embodiments, the display panel DP may include a third area and a fourth area, which are arranged in the non-display area NDA (refer to FIG. 1) of the display panel DP. Outer circuits may be arranged in the third area. Each third area may be connected to a plurality of fourth areas. The fourth areas may be spaced apart from each other by an opening portion positioned between the fourth areas.

According to some embodiments, the third area and the fourth area of the non-display area NDA may have different shapes from the first area 11 and the second area 12 of the display area DA. According to some embodiments, the third area and the fourth area of the non-display area NDA may have the same shape as the first area 11 and the second area 12 of the display area DA.

FIG. 6C is a cross-sectional view schematically illustrating the display panel DP shown in FIG. 6B, taken along the line II-II'.

Referring to FIG. 6C, the first area 11 and the second area 12, which are arranged in the display area DA, may be spaced apart from each other with the opening portion CS therebetween. The first area 11 may include light-emitting elements ED and a circuit electrically connected thereto to drive the light-emitting element ED, for example, the pixel driving circuit unit PC, and the second area 12 may include lines WL electrically connected to the pixel driving circuit units PC.

When looking at the first area 11, the display layer 200 may be located on the substrate 100. The display layer 200 may include the pixel driving circuit unit PC, an insulating layer IL, and the light-emitting element ED. The insulating layer IL may include an inorganic insulating material and/or an organic insulating material. The light-emitting element ED may be located on the insulating layer IL and may be electrically connected to the pixel driving circuit unit PC. The light-emitting elements ED may emit light of different colors or the same color. According to some embodiments, the light-emitting elements ED may respectively emit red, green, and blue light. According to some embodiments, the light-emitting elements ED may emit white light. According to some embodiments, the light-emitting elements ED may respectively emit red, green, blue, and white light.

FIG. 6C shows that three pixel driving circuit units PC and three light-emitting elements ED respectively connected to the pixel driving circuit units PC are arranged in the first area 11, but the disclosure is not limited thereto. According to some embodiments, the number of each of the pixel driving circuit units PC and the light-emitting elements ED, which are arranged in the first area 11, may be one, two, or four or more.

The encapsulation layer 300 may be located on the light-emitting element ED and may protect the light-emitting element ED from external force and/or moisture penetration.

When looking at the second area 12, the insulating layer IL including an organic insulating material may be located on the substrate 100. When the display panel DP is stretched, the second area 12, which is relatively transformed, may not include a layer including an inorganic insulating material that is prone to cracks.

According to some embodiments, the substrate 100 corresponding to the second area 12 may have the same stacked structure as the substrate 100 corresponding to the first area 11. According to some embodiments, the substrate 100 corresponding to the second area 12 may have a different stacked structure from the substrate 100 corresponding to the first area 11. For example, the substrate 100 corresponding to the first area 11 may have a multi-layered structure including base layers each including a polymer resin and a barrier layer including an inorganic insulating material, and the substrate 100 corresponding to the second area 12 may only include the base layers without the barrier layer including the inorganic insulating material.

As described above, the lines WL of the second area 12 may be signal lines (e.g., gate lines, data lines, or the like) for providing electrical signals or voltage lines (e.g., driving voltage lines, initialization voltage lines, or the like) for providing voltages to the pixel driving circuit unit PC. According to some embodiments, the encapsulation layer 300 may also be arranged in the second area 12. According to some embodiments, the encapsulation layer 300 may not be arranged in the second area 12.

The first area 11 and the second area 12 may be spaced apart from each other by the opening portion CS. The opening portion CS may include an opening 100OP1 of the substrate 100, an opening 200OP1 of the display layer 200, and an opening 300OP1 of the encapsulation layer 300, which overlap each other.

Although omitted in FIG. 6C, a touch sensor layer 400 (refer to FIGS. 5A and 5B) including touch electrodes and touch insulating layers may be located on the encapsulation layer 300. The display panel DP may further include the strain sensor layer 600, as described above with reference to FIGS. 5A and 5B.

Figure 7A:
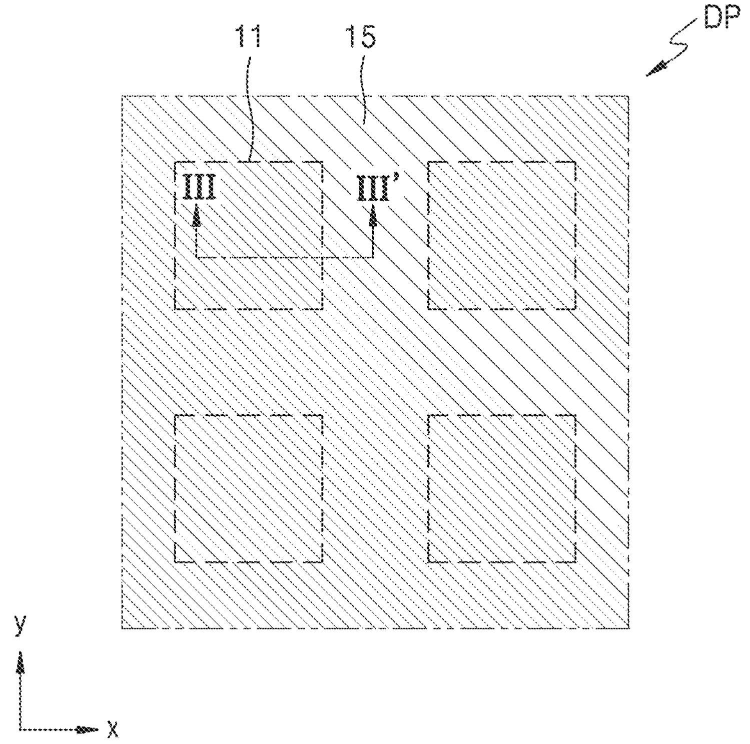
FIG. 7A is a plan view schematically illustrating a portion of a display panel according to some embodiments.
Figure 7B:
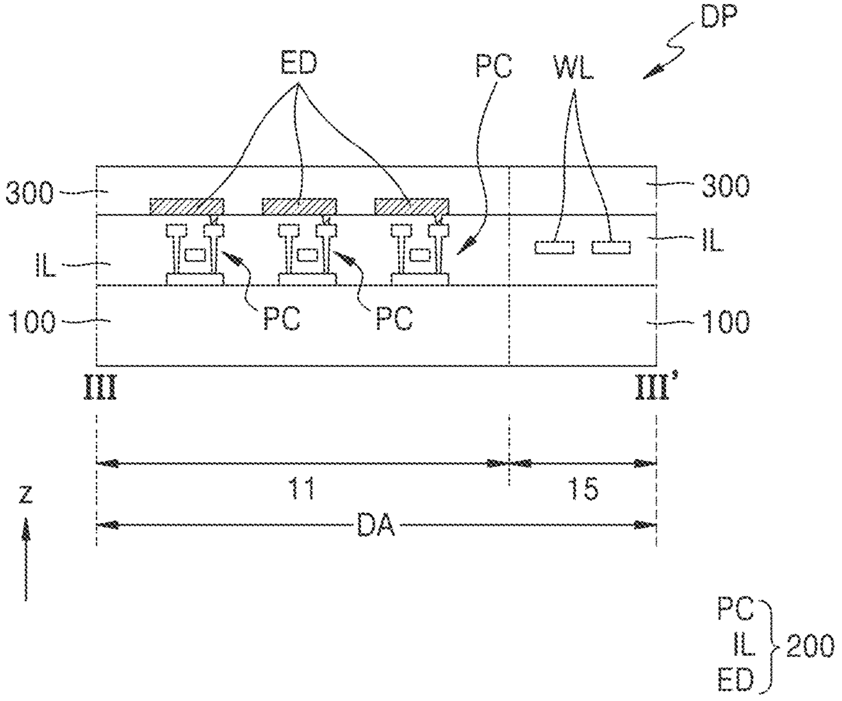
FIG. 7B is a cross-sectional view schematically illustrating the display panel shown in FIG. 7A, taken along a line III-III'.

FIG. 7A is a plan view schematically illustrating a portion of a display panel according to some embodiments, and FIG. 7B is a cross-sectional view schematically illustrating the display panel shown in FIG. 7A, taken along a line III-III'.

Referring to FIGS. 7A and 7B, the display panel DP may include the first areas 11 spaced apart from each other in the first direction (x direction) and the second direction (y direction), and third areas 15 connecting adjacent first areas 11 to each other. A third area 15 is an area between the first areas 11 and is an area through which the lines WL pass. The lines WL may be signal lines (e.g., gate lines, data lines, or the like) for providing electrical signals or voltage lines (e.g., driving voltage lines, initialization voltage lines, or the like) for providing voltages to a transistor included in the pixel driving circuit unit PC.

According to some embodiments, the substrate 100 may include an elastomer. In this case, the display panel DP may be stretched even when a separate opening is not provided between the first area 11 and the third area 15. According to some embodiments, the first area 11 may not extend or may extend less than the third area 15. That is, when the display panel DP is transformed, the elongation rate of the third area 15 may be greater than the elongation rate of the first area 11. According to some embodiments, the first area 11 and the third area 15 may have substantially the same elongation rate.

FIG. 7B shows that three pixel driving circuit units PC and three light-emitting elements ED respectively connected to the pixel driving circuit units PC are arranged in the first area 11, but the disclosure is not limited thereto. According to some embodiments, the number of each of the pixel driving circuit units PC and the light-emitting elements ED, which are arranged in the first area 11, may be one, two, or four or more.

The encapsulation layer 300 may be located on the light-emitting element ED and may protect the light-emitting element ED from external force and/or moisture penetration.

Figure 8A:
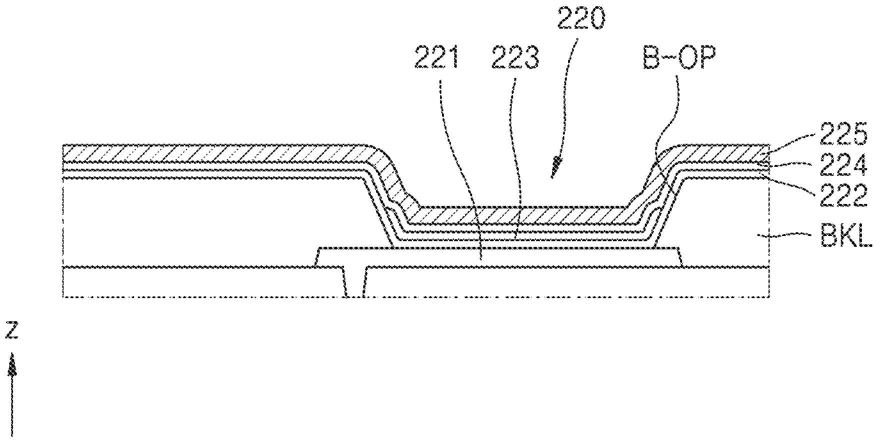
FIGS. 8A and 8B are cross-sectional views each schematically illustrating a light-emitting element of a display apparatus according to some embodiments.
Figure 8B:
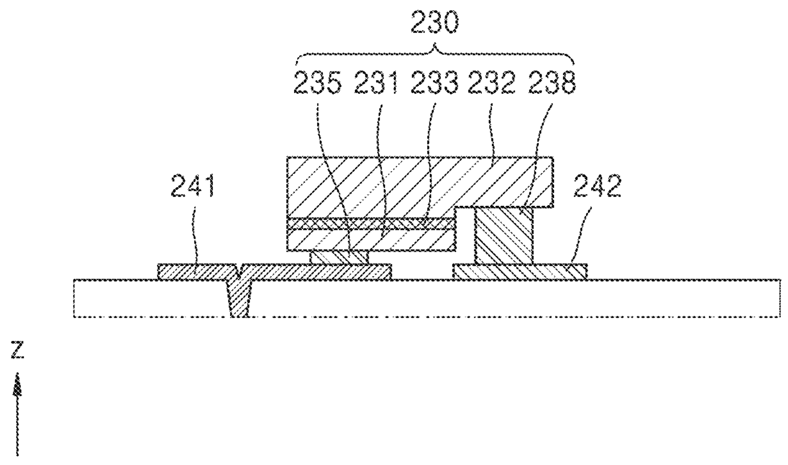

FIGS. 8A and 8B are cross-sectional views each schematically illustrating a light-emitting element of a display apparatus according to some embodiments.

Referring to FIG. 8A, the light-emitting element according to some embodiments may include an organic light-emitting diode 220 including an organic material. The organic light-emitting diode 220 may include a first electrode 221 located on the insulating layer IL (referring to FIG. 6C), a second electrode 225 facing the first electrode 221, and an emission layer 223 arranged between the first electrode 221 and the second electrode 225. A first functional layer 222 may be arranged between the first electrode 221 and the emission layer 223, and a second functional layer 224 may be arranged between the emission layer 223 and the second electrode 225.

An edge of the first electrode 221 may be covered with a bank layer BKL including an insulating material. The bank layer BKL may include an opening B-OP overlapping the central portion of the first electrode 221.

The first electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the first electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the first electrode 221 may further include a layer including ITO, IZO, ZnO, or $In_2O_3$ above/below the reflective layer stated above.

The emission layer 223 may include a polymer organic material or a low-molecular-weight organic material, which emits light of a certain color. The first functional layer 222 may include a hole transport layer and/or a hole injection layer. The second functional layer 224 may include an electron transport layer and/or an electron injection layer.

The second electrode 225 may include a conductive material having a low work function. For example, the second electrode 225 may include a (semi) transparent layer including Ag, Mg, Al, Pt, Pd, Au, Ni, Nd, Ir, Cr, lithium (Li), calcium (Ca), alloys thereof, or the like. Alternatively, the second electrode 225 may further include a layer, such as ITO, IZO, ZnO, or $In_2O_3$, above the (semi) transparent layer including the above-stated material.

Referring to FIG. 8B, the light-emitting element according to some embodiments may include an inorganic light-emitting diode 230 including an inorganic material. The inorganic light-emitting diode 230 may include a first semiconductor layer 231, a second semiconductor layer 232, an intermediate layer 233 between the first semiconductor layer 231 and the second semiconductor layer 232, a first electrode 235 electrically connected to the first semiconductor layer 231, and a second electrode 238 electrically connected to the second semiconductor layer 232. The first electrode 235 and the second electrode 238 of the inorganic light-emitting diode 230 may respectively be electrically connected to a first electrode pad 241 and a second electrode pad 242, which are located on the same layer.

In some embodiments, the first semiconductor layer 231 may include a p-type semiconductor layer. The p-type semiconductor layer is a semiconductor material with a composition formula of $In_xAl_yGa_{1-x-y}N$ ($0 \le x \le 1$, $0 \le y \le 1$, $0 \le x+y \le 1$), which may, for example, be selected from among GaN, AlN, AlGaN, InGaN, InN, InAlGaN, AlInN, or the like, and may be doped with a p-type dopant such as Mg, Zn, Ca, Sr, Ba, or the like.

The second semiconductor layer 232 may include, for example, an n-type semiconductor layer. The n-type semiconductor layer is a semiconductor material having a composition formula of $In_xAl_yGa_{1-x-y}N$ ($0 \le x \le 1$, $0 \le y \le 1$, $0 \le x+y \le 1$), which may, for example, be selected from among GaN, AlN, AlGaN, InGaN, InN, InAlGaN, AlInN, or the like, and may be doped with an n-type dopant such as Si, Ge, Sn, or the like.

The intermediate layer 233 is a region where electrons and holes are recombined. As the electrons and holes are recombined, the intermediate layer 233 may transition to a low energy level and generate light having a corresponding wavelength. For example, the intermediate layer 233 may be formed by including a semiconductor material having a composition formula of $In_xAl_yGa_{1-x-y}N$ ($0 \le x \le 1$, $0 \le y \le 1$, $0 \le x+y \le 1$), and may be formed as a single-quantum well structure or a multi-quantum well (MQW) structure. In addition, the intermediate layer 233 may also include a quantum wire structure or a quantum dot structure.

FIG. 8B shows that the first semiconductor layer 231 includes a p-type semiconductor layer, and the second semiconductor layer 232 includes an n-type semiconductor layer, but the disclosure is not limited thereto. According to some embodiments, the first semiconductor layer 231 may include an n-type semiconductor layer, and the second semiconductor layer 232 may include a p-type semiconductor layer.

Figure 9A:
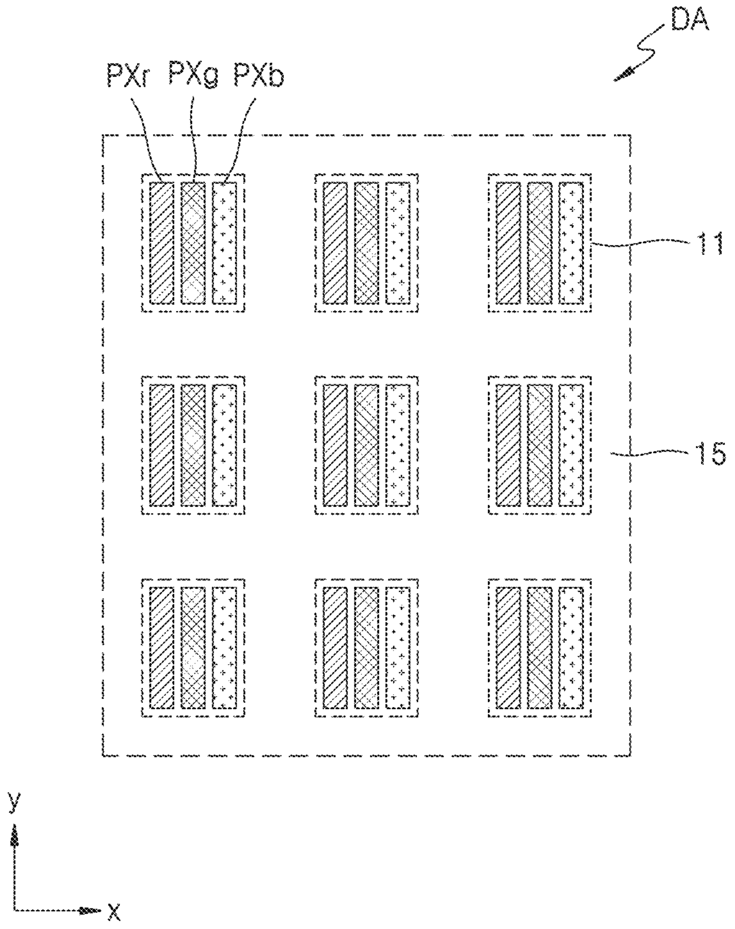
FIGS. 9A and 9B are plan views each schematically illustrating a portion of a display area according to an embodiment.
Figure 9B:
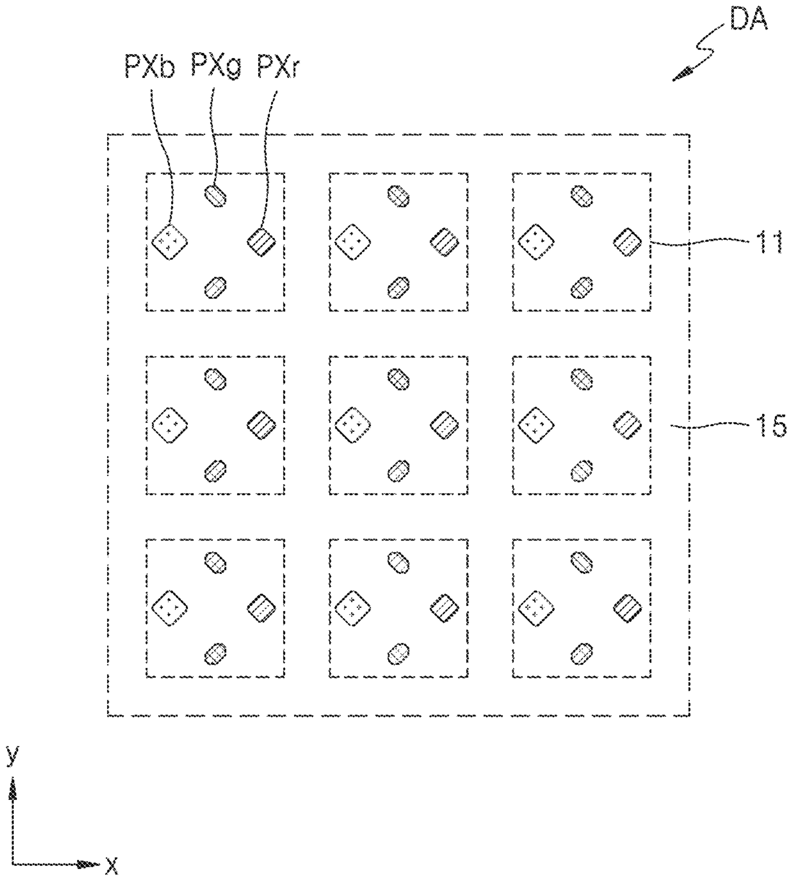

FIGS. 9A and 9B are plan views each schematically illustrating a portion of a display area according to some embodiments.

Referring to FIGS. 9A and 9B, the display area DA may include the first areas 11 and the third area 15 between the first areas 11. The first area 11 may include at least one unit pixel. The unit pixel may be a minimum repeating unit of pixels having a certain arrangement. According to some embodiments, as shown in FIG. 9A, pixels may be arranged in a stripe structure in the display area DA. One unit pixel may be arranged in the first area 11, and the unit pixel may include one red pixel PXr, one green pixel PXg, and one blue pixel PXb.

According to some embodiments, as shown in FIG. 9B, pixels may be arranged in a Pentile® structure in the display area DA. One unit pixel may be arranged in the first area 11, and the unit pixel may include one red pixel PXr, two green pixels PXg, and one blue pixel PXb.

In FIGS. 9A and 9B, the first area 11 has a rectangular shape in a plan view, but the first area 11 may have various polygonal shapes, such as a hexagonal shape, a circular shape, or the like. The third area 15 may be an area through which signal lines (e.g., gate lines, data lines, voltage lines, or the like) providing signals to pixels arranged in the first areas 11 pass.

FIGS. 9A and 9B show the display panel DP without a separate opening between the first area 11 and the third area 15, as described above with reference to FIG. 7A, but the disclosure is not limited thereto. Such an arrangement of pixels may be applied in the same or similar manner to the first area 11 of the display panel DP described above with reference to FIGS. 6A and 6B.

Figure 10A:
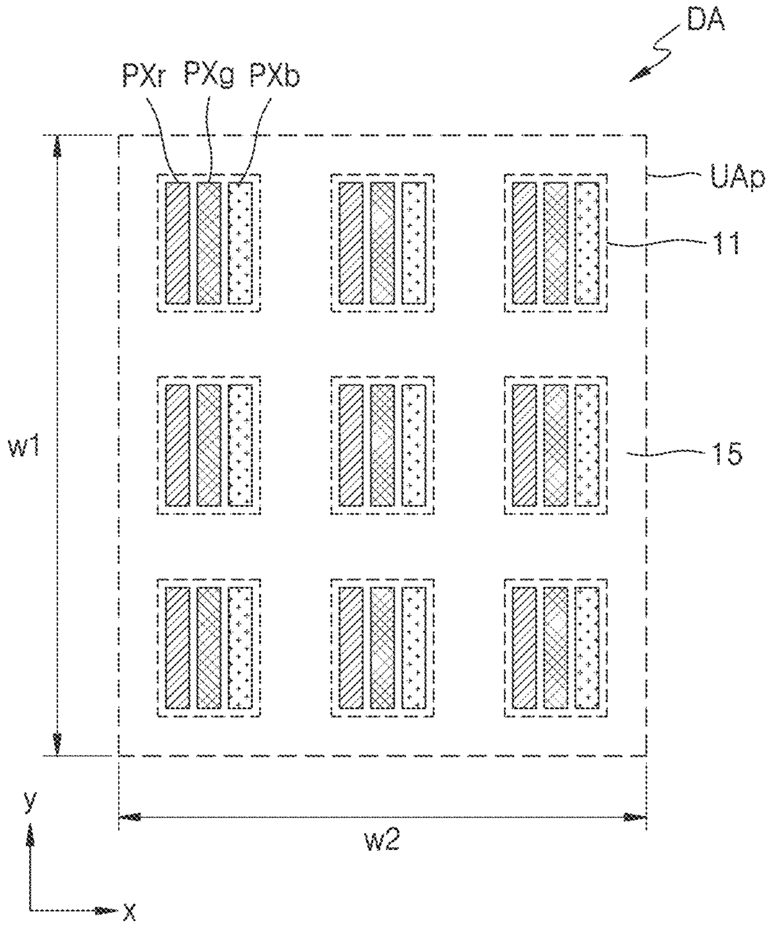
FIGS. 10A, 10B, and 10C are diagrams respectively illustrating changes in area of a unit area due to stretching of a display area.
Figure 10B:
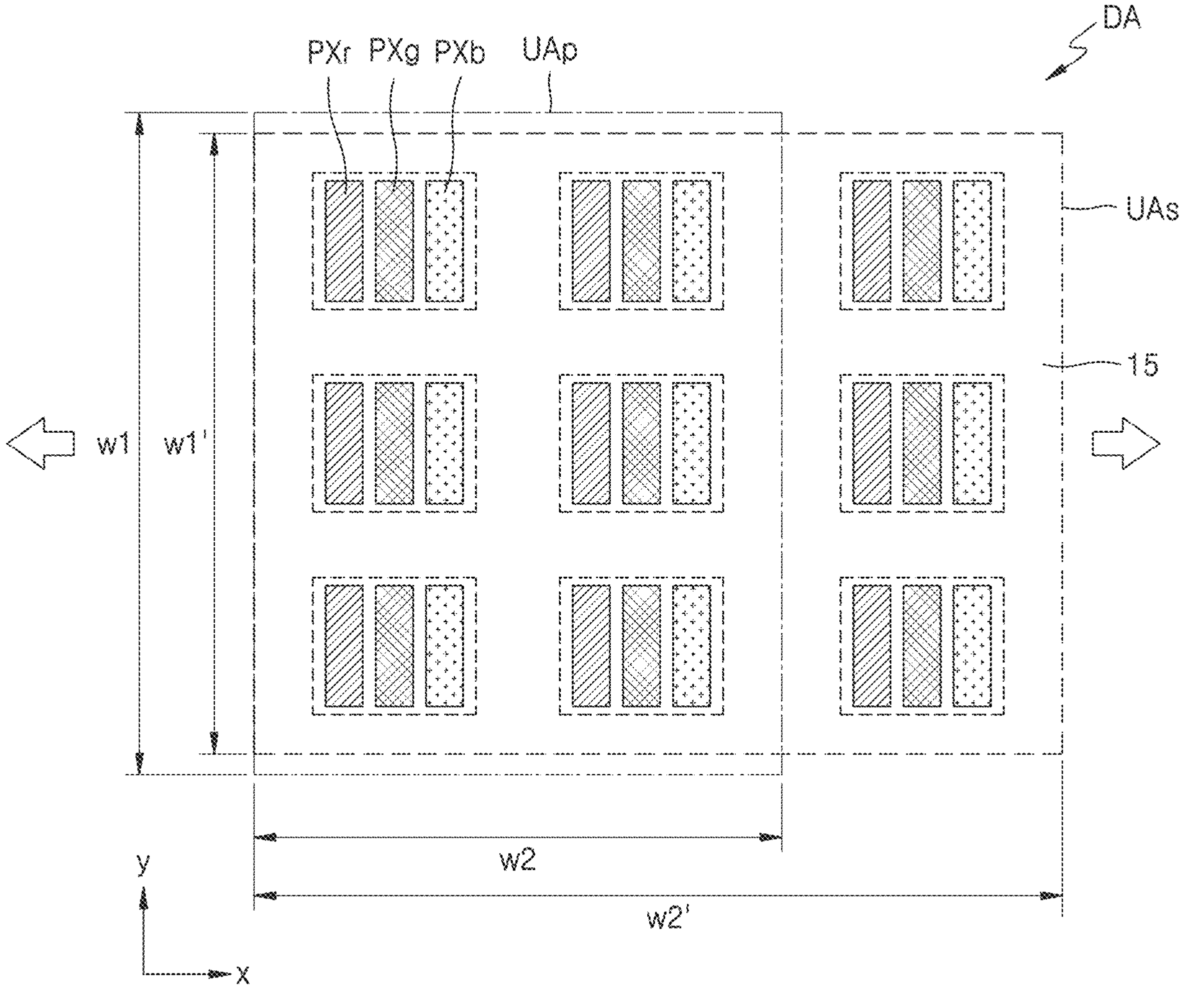
Figure 10C:
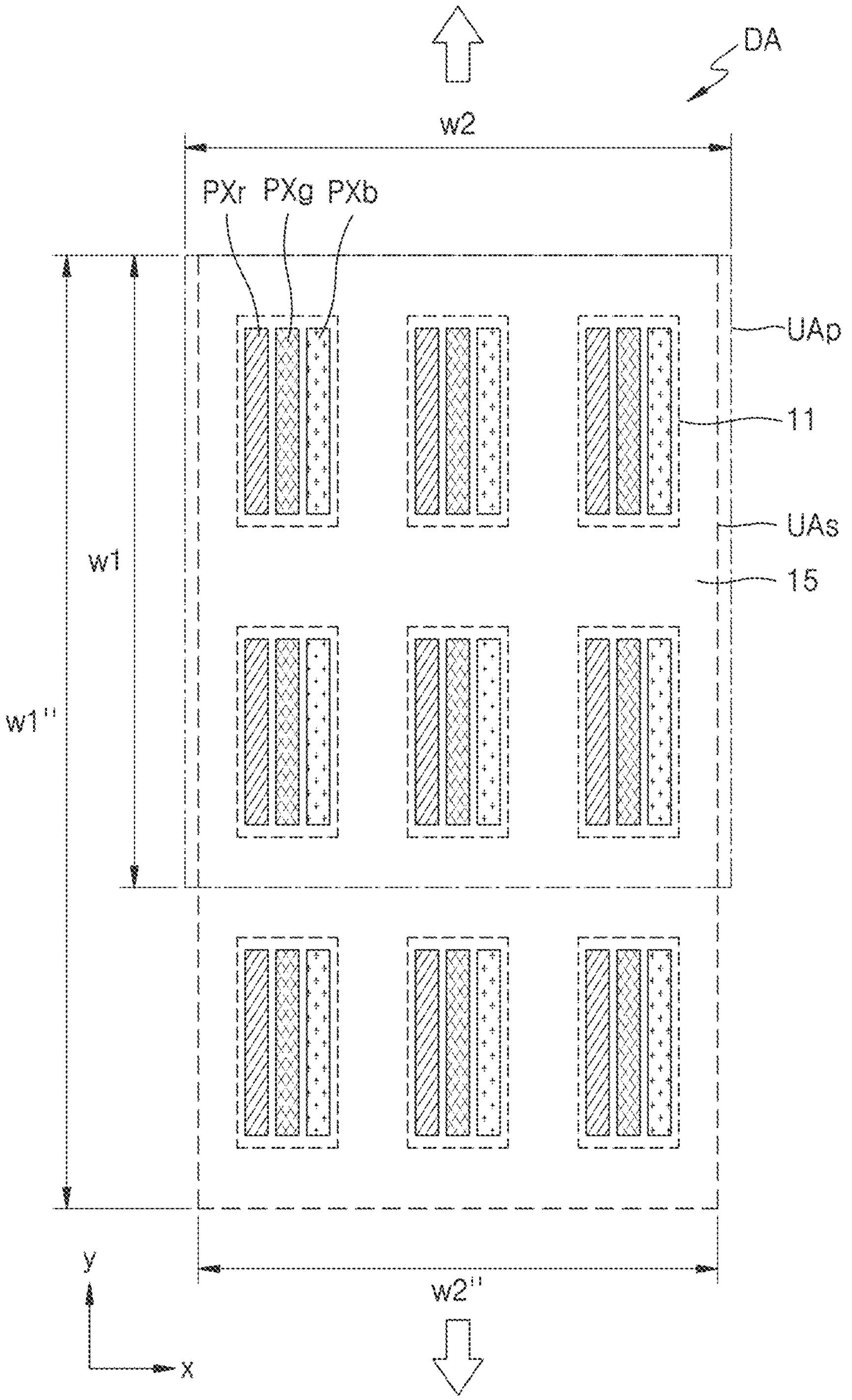

FIGS. 10A, 10B, and 10C are diagrams respectively illustrating changes in area of a unit area due to stretching of a display area.

Hereinafter, the change in area of the unit area, which is a portion of the display area DA, is described with reference to FIGS. 10A, 10B, and 10C. Herein, the unit area is an area defined to explain a change in density of the pixels PX due to stretching of the display area DA, which includes 3×3 first areas 11 (e.g., nine first areas) and the third area 15 surrounding the first areas 11. One red pixel PXr, one green pixel PXg, and one blue pixel PXb may be arranged in the first area 11. In an initial state before the display area DA is stretched or shrunk, a unit area UAp before stretching may have a first width w1 in a second direction (y direction) and a second width w2 in a first direction (x direction).

As described above with reference to FIG. 2A, as the display area DA is stretched in the first direction (x direction), the unit area may be stretched in the first direction (x direction). Referring to FIG. 10B, a unit area UAs after stretching may have a first 'width w1' in the second direction (y direction) and a second 'width w2' in the first direction (x direction). The first 'width w1' may be equal to or less than the first width w1 of the unit area UAp before stretching, and the second 'width w2' may be greater than the second width w2 of the unit area UAp before stretching.

A reduced number of first areas 11, for example only 3×2 first areas 11 (e.g., six first areas) may be arranged in an area having the same area as the unit area UAp before stretching. Accordingly, when the display area DA is stretched, the density of pixels PX per same area may decrease. Due to stretching, the area of an emission area (hereinafter referred to as 'emission area') of each of pixels PX may increase in the first direction (x direction) and decrease in the second direction (y direction).

As shown in FIG. 2C, as the display area DA is stretched in the second direction (y direction), the unit area may be stretched in the second direction (y direction). Referring to FIG. 10C, the unit area UAs after stretching may have a first "width w1" in the second direction (y direction) and a second "width w2" in the first direction (x direction). The first "width w1" may be greater than the first width w1 of the unit area UAp before stretching, and the second "width w2" may be equal to or less than the second width w2 of the unit area UAp before stretching.

A reduced number of first areas 11, for example, only 2×3 first areas 11 (e.g., six first areas) may be arranged in an area having the same area as the unit area UAp before stretching. Accordingly, when the display area DA is stretched, the density of pixels PX per same area may decrease. Due to stretching, the area of an emission area of each of the pixels PX may decrease in the first direction (x direction) and increase in the second direction (y direction).

That is, when the display area DA is stretched, a distance between the pixels PX positioned within the stretched area may increase, and the density of pixels within the stretched area may decrease. In addition, the area of an emission area of each of the pixels PX positioned within the stretched area may change.

As described above with reference to FIG. 3, the display apparatus 1 according to some embodiments may include the stretch compensation unit SCC. The stretch compensation unit SCC may generate the stretch compensation data SCD to compensate for changes in luminance and color coordinates of the stretched area due to a change in density of pixels and a change in area of an emission area of each of the pixels PX. Accordingly, the display apparatus 1 may display a high-quality image by relatively reducing changes in image quality due to stretching.

Figure 11A:
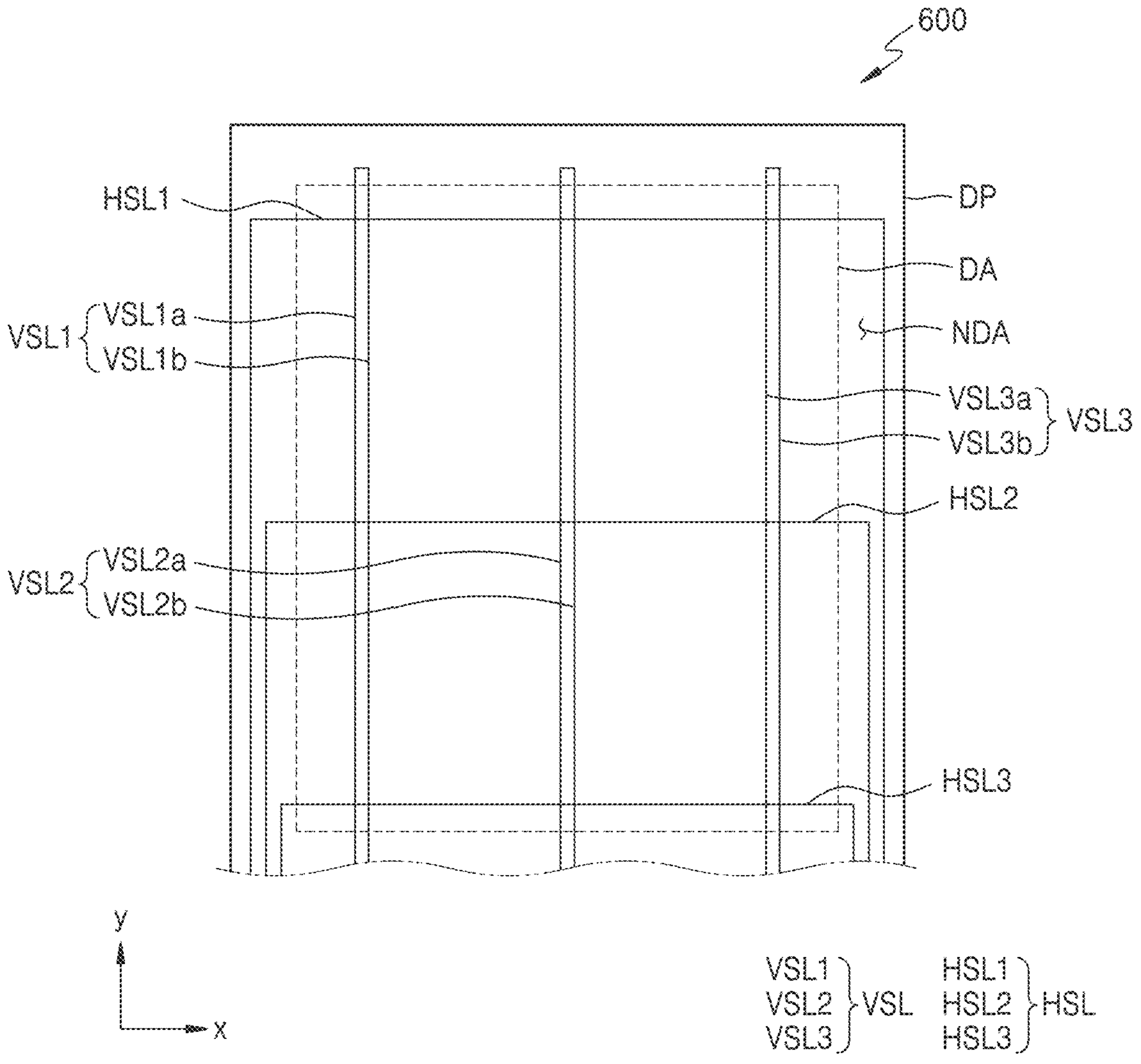
FIGS. 11A and 11B are plan views each schematically illustrating a strain sensor layer according to some embodiments.
Figure 11B:
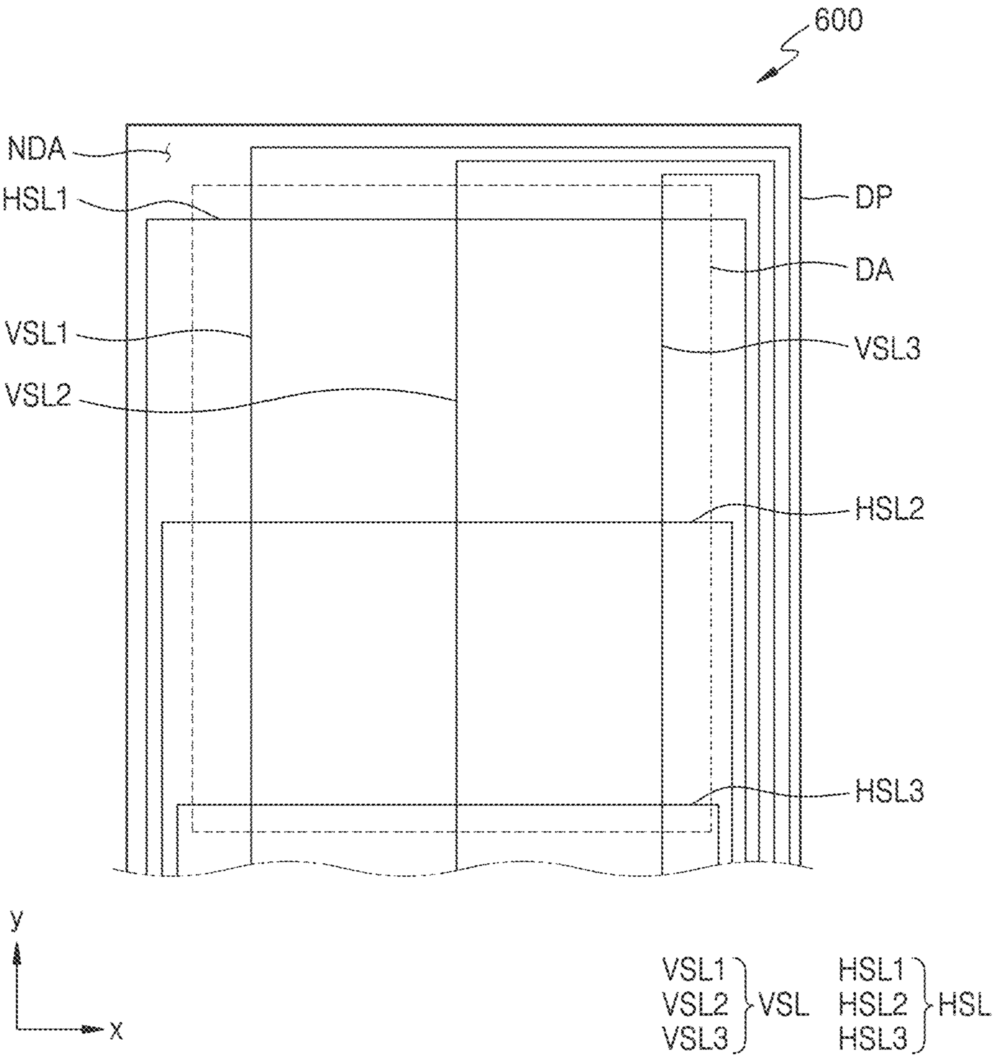

FIGS. 11A and 11B are plan views each schematically illustrating a strain sensor layer according to some embodiments.

Referring to FIG. 11A, the display panel DP may include the strain sensor layer 600. The strain sensor layer 600 may include horizontal sensing lines HSL extending in a first direction (x direction) in the display area DA and vertical sensing lines VSL extending in a second direction (y direction) in the display area DA.

A plurality of horizontal sensing lines HSL and a plurality of vertical sensing lines VSL may be provided. For example, k horizontal sensing lines HSL (where k is a natural number greater than or equal to 2) may be provided, and l vertical sensing lines VSL (where l is a natural number greater than or equal to 2) may be provided.

For example, the horizontal sensing lines HSL may include a first horizontal sensing line HSL1 crossing the upper side (+y side) of the display area DA in the first direction (x direction), a second horizontal sensing line HSL2 crossing the central area of the display area DA in the first direction (x direction), and a third horizontal sensing line HSL3 crossing the lower side (−y side) area of the display area DA in the first direction (x direction). The vertical sensing lines VSL may include a first vertical sensing line VSL1 crossing the left side (−x side) area of the display area DA in the second direction (y direction), a second vertical sensing line VSL2 crossing the central area of the display area DA in the second direction (y direction), and a third vertical sensing line VSL3 crossing the right side (+x side) of the display area DA in the second direction (y direction). That is, three horizontal sensing lines HSL and three vertical sensing lines VSL may be arranged in the display area DA.

According to some embodiments, each of the vertical sensing lines VSL may include a pair of sub-sensing lines crossing the display area DA. For example, as shown in FIG. 11A, the first vertical sensing line VSL1 may include a first sub-sensing line VSL1*a* and a second sub-sensing line VSL1*b*, the second vertical sensing line VSL2 may include a third sub-sensing line VSL2*a* and a fourth sub-sensing line VSL2*b*, and the third vertical sensing line VSL3 may include a fifth sub-sensing line VSL3*a* and a sixth sub-sensing line VSL3*b*. The pair of sub-sensing lines may be arranged adjacent to each other and may be connected to each other in the non-display area NDA.

In FIG. 11A, each of the vertical sensing lines VSL is arranged to cross the display area DA twice by including a pair of sub-sensing lines, but the disclosure is not limited thereto. Referring to FIG. 11B, each of the vertical sensing lines VSL may be arranged to cross the display area DA once. For example, each of the vertical sensing lines VSL may include a first portion connected to a corresponding vertical input line VIL (refer to FIG. 12) and extending to the upper side (+y side) of the display panel DP to cross the display area DA, and a second portion connected to corresponding vertical output lines VOL (refer to FIG. 12) and bypassing the display area DA and extending to the lower side (−y side) of the display panel DP along the non-display area NDA.

The horizontal sensing lines HSL and the vertical sensing lines VSL may intersect each other in the display area DA to form a mesh structure in a plan view. The horizontal sensing lines HSL and the vertical sensing lines VSL may be located on different layers and may be electrically separated by at least one insulating layer.

FIGS. 11A and 11B show the strain sensor layer 600 includes three horizontal sensing lines HSL and three vertical sensing lines VSL, but the disclosure is not limited thereto. The number of sensing lines may be variously changed, for example, the strain sensor layer 600 may include two horizontal sensing lines HSL and two vertical sensing lines VSL or four horizontal sensing lines HSL and two vertical sensing lines VSL. In addition, the horizontal sensing lines HSL and the vertical sensing lines VSL may be arranged more densely in vulnerable areas where stress due to stretching is concentrated by considering the stretching direction, the elongation rate, or the like of the display panel DP.

Figure 12:
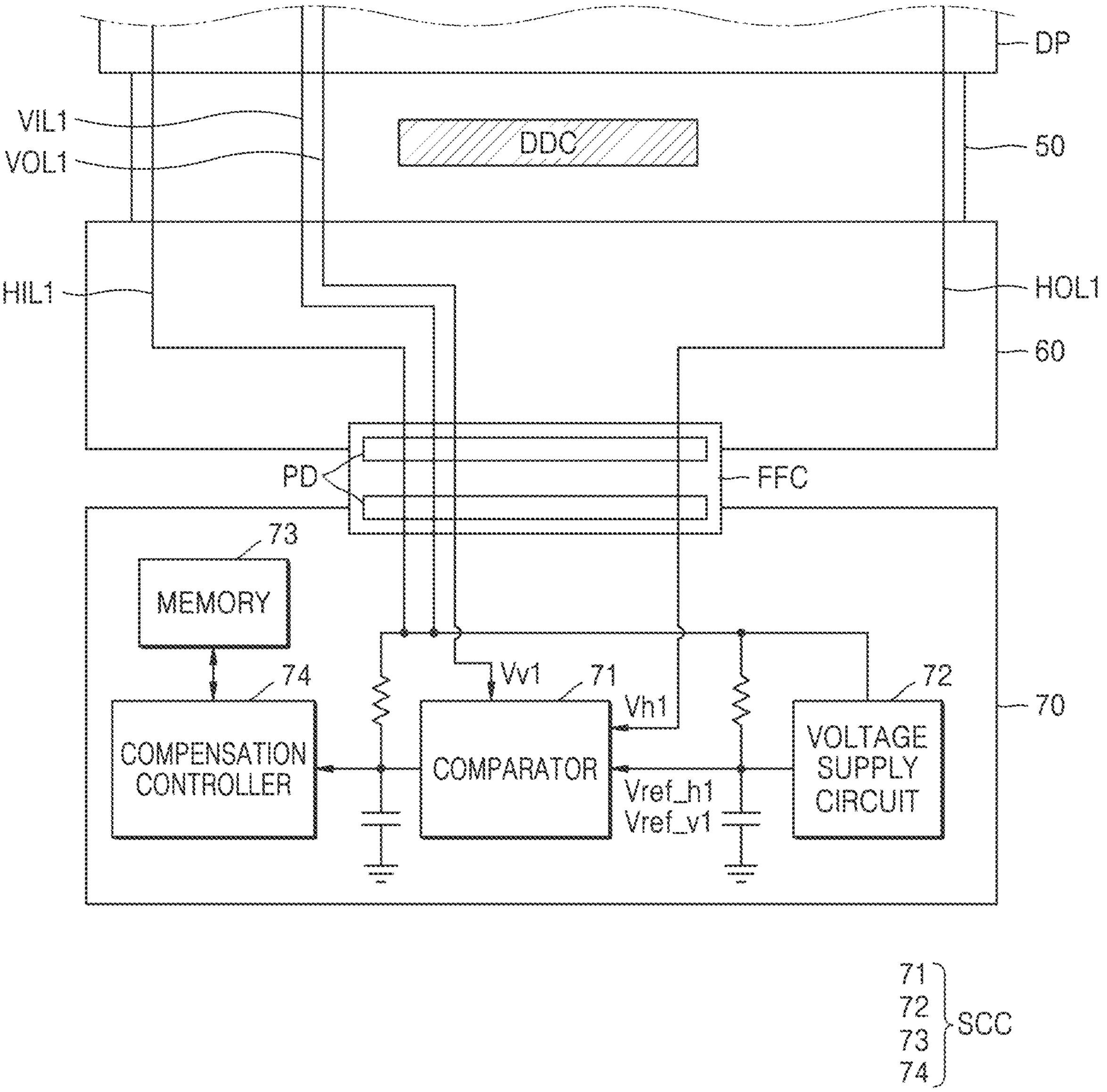
FIG. 12 is a diagram schematically illustrating a strain sensor layer and a stretch compensation unit according to some embodiments.
Figure 13:
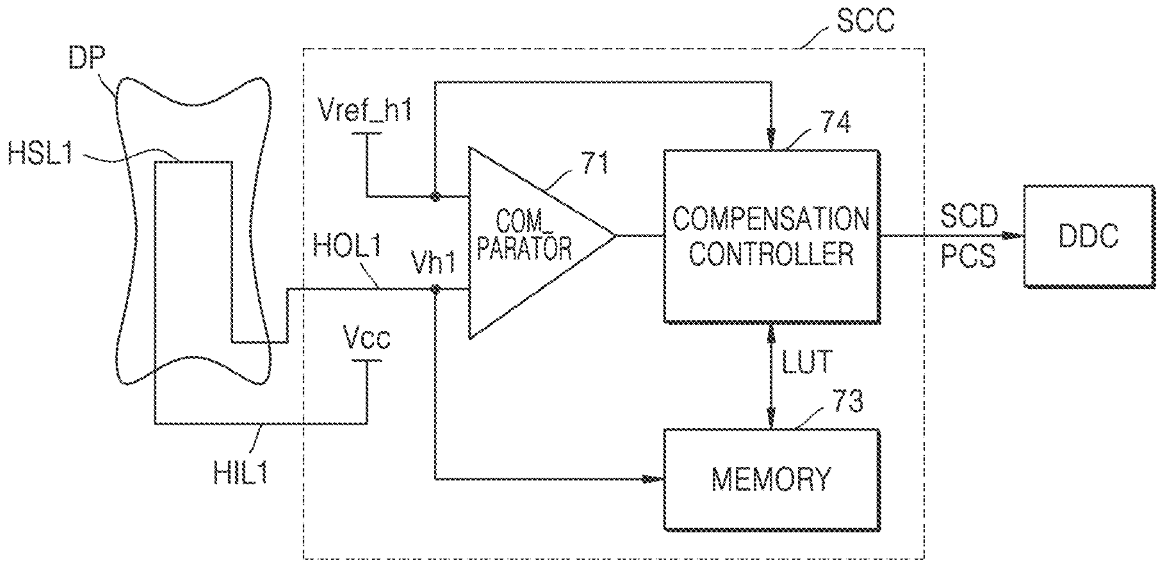
FIG. 13 is a diagram for schematically describing the operation of a stretch compensation unit according to some embodiments.

FIG. 12 is a diagram schematically illustrating a strain sensor layer and a stretch compensation unit according to some embodiments, and FIG. 13 is a diagram for schematically describing an operation of a stretch compensation unit according to some embodiments.

Referring to FIG. 12, the display apparatus 1 (refer to FIG. 3) may include the display panel DP, a first circuit substrate 50, a second circuit substrate 60, a third circuit substrate 70 connected to the second circuit substrate 60 via a connector FFC.

The display panel DP may be electrically connected to the first circuit substrate 50 through a pad located on one side of a substrate. According to some embodiments, the first circuit substrate 50 may be an FPCB on which at least a portion of the display driving unit DDC is located. The first circuit substrate 50 may be electrically connected to the second circuit substrate 60 through a pad located on one side of the first circuit substrate 50. According to some embodiments, the second circuit substrate 60 may be a printed circuit board.

Horizontal input lines, horizontal output lines, vertical input lines, and vertical output lines may be located on the first circuit substrate 50 and the second circuit substrate 60. FIG. 12 only shows a first horizontal input line HIL1, a first horizontal output line HOL1, a first vertical input line VIL1, and a first vertical output line VOL1, for convenience of explanation.

The first horizontal input line HIL1, the first horizontal output line HOL1, the first vertical input line VIL1, and the first vertical output line VOL1 may be connected to the stretch compensation unit SCC through the connector FFC connected to a pad unit PD located on one side of the second circuit substrate 60. The stretch compensation unit SCC may be arranged in the third circuit substrate 70.

Horizontal input lines may include the first horizontal input line HIL1 connected to the first horizontal sensing line HSL1 (refer to FIG. 11A). One end of the first horizontal input line HIL1 may be connected to the stretch compensation unit SCC, and the other end thereof may be connected to the first horizontal sensing line HSL1 to transmit a sensor driving voltage to the first horizontal sensing line HSL1. Horizontal output lines may include the first horizontal output line HOL1 connected to the first horizontal sensing line HSL1. One end of the first horizontal output line HOL1 may be connected to the stretch compensation unit SCC, and the other end thereof may be connected to the first horizontal sensing line HSL1, so that the stretch compensation unit SCC may measure a first horizontal measurement voltage Vh1 of the first horizontal sensing line HSL1.

Vertical input lines may include the first vertical input line VIL1 connected to the first sub-sensing line VSL1*a* (refer to FIG. 11A). One end of the first vertical input line VIL1 may be connected to the stretch compensation unit SCC, and the other end thereof may be connected to the first sub-sensing line VSL1*a* to transmit a sensor driving voltage to the first vertical sensing line VSL1. Vertical output lines may include the first vertical output line VOL1 connected to the second sub-sensing line VSL1*b* (refer to FIG. 11A). One end of the first vertical output line VOL1 may be connected to the stretch compensation unit SCC, and the other end thereof may be connected to a corresponding vertical sensing line VSL, so that the stretch compensation unit SCC may measure a first vertical measurement voltage Vv1 of the second sub-sensing line VSL1*b*.

Horizontal input lines, horizontal output lines, vertical input lines, vertical output lines may respectively have similar connection relationships to the first horizontal input line HIL1, the first horizontal output line HOL1, the first vertical input line VIL1, and the first vertical output line VOL1.

FIG. 12 shows that the first circuit substrate 50, the second circuit substrate 60, and the third circuit substrate 70 are separately provided, but the disclosure is not limited thereto. According to some embodiments, the first circuit substrate 50, the second circuit substrate 60, and the third circuit substrate 70 may be integrally provided. For example, the stretch compensation unit SCC may be mounted on the first circuit substrate 50, and the second circuit substrate 60, the connector FFC, and the third circuit substrate 70 may be omitted. According to some embodiments, the stretch compensation unit SCC may be mounted on the second circuit substrate 60, and the third circuit substrate 70 and the connector FFC may be omitted.

The stretch compensation unit SCC may include a comparator 71, a voltage supply circuit 72, a memory 73, and a compensation controller 74. The first horizontal input line HIL1 and the first vertical input line VIL1 may be electrically connected to the voltage supply circuit 72, and the first horizontal output line HOL1 and the first vertical output line VOL1 may be electrically connected to the comparator 71.

The voltage supply circuit 72 may supply respective reference voltages (including a first horizontal reference voltage Vref_h1 and a first vertical reference voltage Vref_v1) of the first horizontal input line HIL1 and the first vertical input line VIL1 and a sensor driving voltage. According to some embodiments, the voltage supply circuit 72 may differently supply the respective reference voltages Vref_h1 and Vref_v1 of the first horizontal input line HIL1 and the first vertical input line VIL1 according to the degree of stretching (or the stage of stretching) of the display panel DP. To this end, the voltage supply circuit 72 may be provided as a power integrated circuit (IC) chip.

Referring to FIGS. 12 and 13 together, the comparator 71 may compare two voltages input to an input terminal pair and output an output value corresponding to a larger voltage among the two voltages. The comparator 71 may include a plurality of input terminal pairs including a first input terminal and a second input terminal.

A first input terminal pair may include a first input terminal to which the first horizontal output line HOL1 is electrically connected, and a second input terminal to which the voltage supply circuit 72 is electrically connected. The voltage supply circuit 72 may supply the first horizontal reference voltage Vref_h1 to the second input terminal of the first input terminal pair. A voltage (hereinafter referred to as a first horizontal measurement voltage Vh1) corresponding to the electrical characteristics of the first horizontal sensing line HSL1, which is measured through the first horizontal output line HOL1, may be different from a sensor driving voltage Vcc. For example, when the first horizontal sensing line HSL1 is stretched in a first direction (x direction), the resistance of the first horizontal sensing line HSL1 may increase, and the first horizontal measurement voltage Vh1 may decrease. The first horizontal reference voltage Vref_h1 is a first horizontal measurement voltage at a time point when a change in luminance or color coordinates due to stretching of the display panel DP is recognized by the user and stretch compensation is required, which may be stored in advance in a manufacturing process of the display apparatus.

The comparator 71 may compare the first horizontal measurement voltage Vh1 with the first horizontal reference voltage Vref_h1 to output a first value to the compensation controller 74 when the first horizontal measurement voltage Vh1 is less than or equal to the first horizontal reference voltage Vref_h1 and output a second value to the compensation controller 74 when the first horizontal measurement voltage Vh1 is greater than the first horizontal reference voltage Vref_h1.

A second input terminal pair may include a third input terminal to which the first vertical output line VOL1 is electrically connected, and a fourth input terminal to which the voltage supply circuit 72 is electrically connected. The voltage supply circuit 72 may supply the first vertical reference voltage Vref_v1 to the fourth input terminal to the second input terminal pair. A voltage (hereinafter referred to as a first vertical measurement voltage Vv1) corresponding to the electrical characteristics of the first vertical sensing line VSL1 (refer to FIG. 11A), which is measured through the first vertical output line VOL1, may be different from the sensor driving voltage Vcc. For example, when the first vertical sensing line VSL1 is stretched in a second direction (y direction), the resistance of the first vertical sensing line VSL1 may increase, and the first vertical measurement voltage Vv1 may decrease. The first vertical reference voltage Vref_v1 is a first vertical measurement voltage at a time point when a change in luminance or color coordinates due to stretching of the display panel DP is recognized by the user and stretch compensation is required, which may be stored in advance in a manufacturing process of the display apparatus.

The comparator 71 may compare the first vertical measurement voltage Vv1 and the first vertical reference voltage Vref_v1 to output a first value to the compensation controller 74 when the first vertical measurement voltage Vv1 is less than or equal to the first vertical reference voltage Vref_v1 and output a second value to the compensation controller 74 when the first vertical measurement voltage Vv1 is greater than the first vertical reference voltage Vref_v1.

The memory 73 may store a plurality of look-up tables LUT and reference voltage information. The reference voltage information may include respective reference voltage values of the horizontal sensing line HSL (refer to FIG. 11A) and the vertical sensing line VSL (refer to FIG. 11A). According to some embodiments, the reference voltage information may include a plurality of reference voltage values according to the stages of stretching of the display panel DP for each of the horizontal sensing lines HSL and the vertical sensing lines VSL. The voltage supply circuit 72 may supply respective reference voltages of the horizontal sensing lines HSL and the vertical sensing lines VSL to the comparator 71 based on the reference voltage information prestored in the memory 73.

The compensation controller 74 may generate comparison data based on output values of the comparator 71, select a look-up table LUT corresponding to the comparison data from among the plurality of look-up tables LUT prestored in the memory 73, and generate the stretch compensation data SCD based on the selected look-up table LUT. To this end, the compensation controller 74 may include a microprocessor (MPU) or a microcontroller (MCU), or the like.

The comparison data may include an output value of the comparator 71 for each of the horizontal sensing lines HSL and the vertical sensing lines VSL. When the comparator 71 outputs a first value for the first horizontal sensing line HSL1, the compensation controller 74 may determine that stretch compensation is required as at least a partial area of the upper side (+y side) area of the display area DA (refer to FIG. 11A) is stretched in the first direction (x direction). When the comparator 71 outputs a first value for the first vertical sensing line VSL1, the compensation controller 74 may determine that stretch compensation is required as at least a partial area of the left side (−x side) area of the display area DA (refer to FIG. 11A) is stretched in the second direction (y direction). When the comparator 71 outputs the first value for the first horizontal sensing line HSL1 and outputs the first value for the first vertical sensing line VSL1, the compensation controller 74 may determine that stretch compensation is required as the upper left side area of the display area DA, where the first horizontal sensing line HSL1 and the first vertical sensing line VSL1 intersect each other, is stretched in the first direction (x direction) and the second direction (y direction) or a third direction (z direction).

According to some embodiments, the memory 73 may periodically store a measurement voltage value of each of the horizontal sensing lines HSL and a measurement voltage value of each of the vertical sensing lines VSL. The compensation controller 74 may receive initial voltage information, the measurement voltage value of each of the horizontal sensing lines HSL, and the measurement voltage value of each of the vertical sensing lines VSL from the memory 73. Herein, the initial voltage information may be respective measurement voltage values of the horizontal sensing lines HSL and the vertical sensing lines VSL, which are stored in an initial state before the display panel DP is stretched. The compensation controller 74 may determine a compensation strength based on differences between measurement voltage values and initial voltage values. In this case, the compensation controller 74 may generate stretch compensation data including the compensation strength.

Because the comparator 71 quickly compares two input voltages and outputs a corresponding result, the compensation controller 74 may quickly determine an area that needs stretch compensation by using comparison data and may select a look-up table LUT corresponding to the area. Accordingly, the display apparatus according to some embodiments may prevent or relatively reduce changes in image quality due to stretching of a display panel from being recognized by the user by correcting an image in real-time during stretching and/or after completion of stretching of the display panel.

Figure 14A:
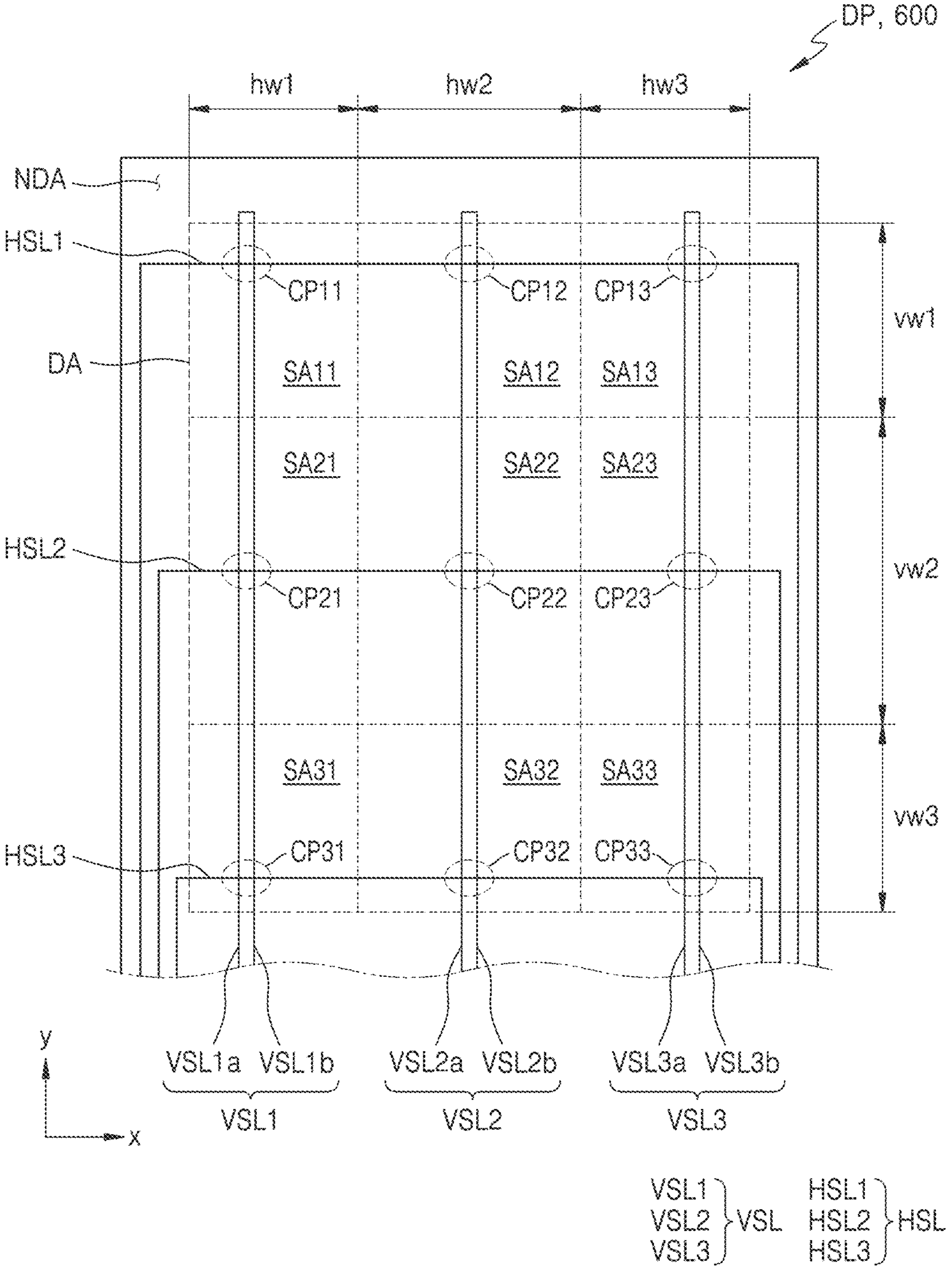
FIGS. 14A and 14B are plan views each describing sub-areas according to some embodiments.
Figure 14B:
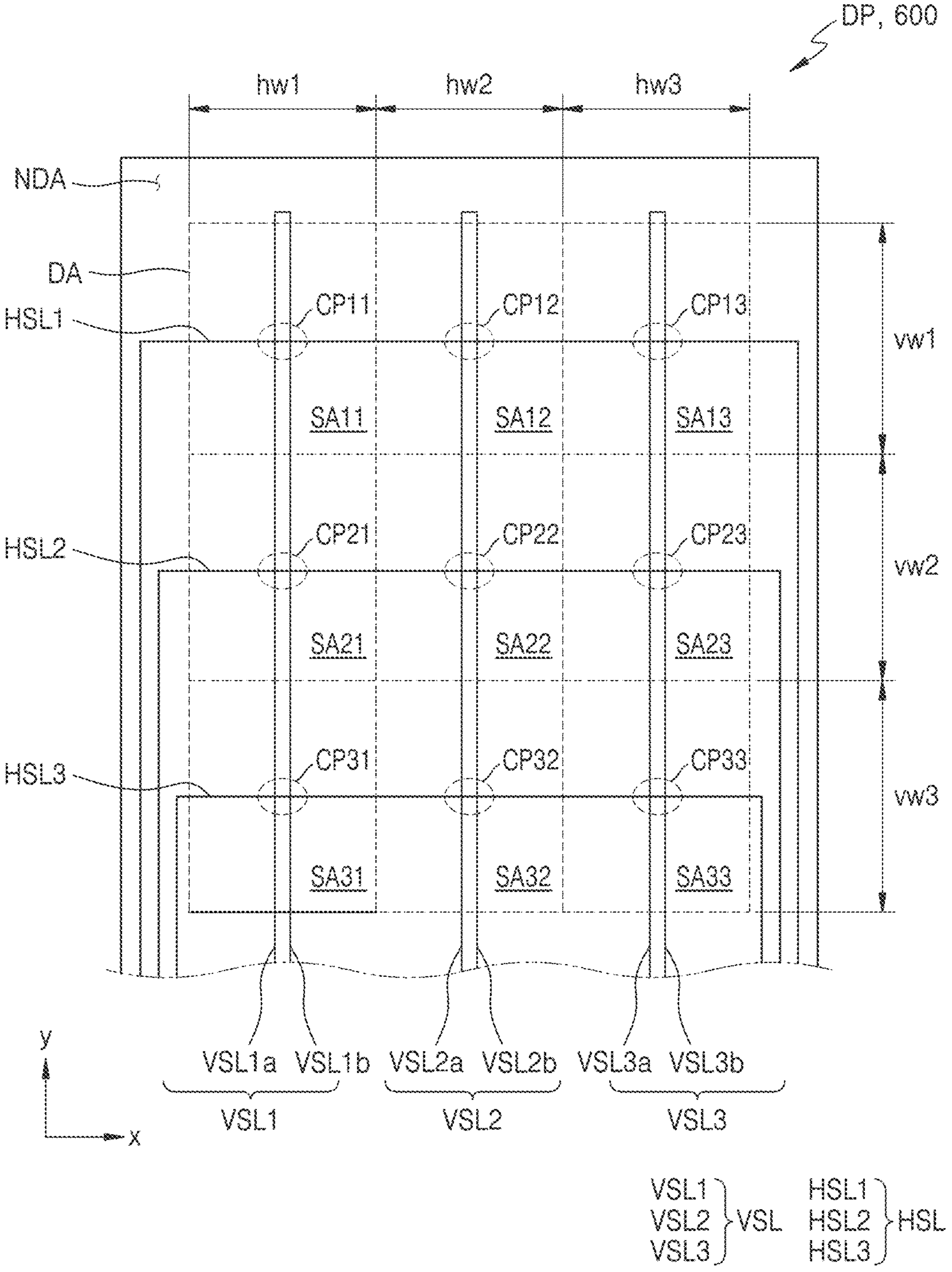
Figure 15:
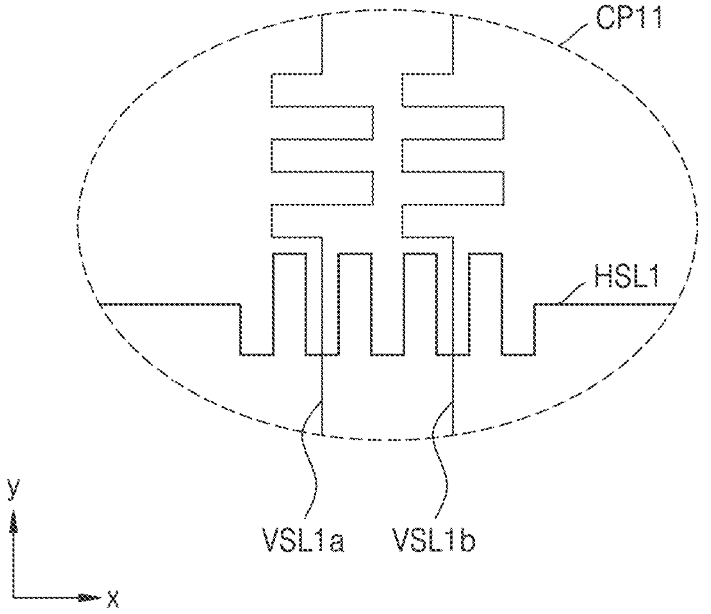
FIG. 15 is a diagram for schematically describing an intersection area according to some embodiments.

FIGS. 14A and 14B are plan views each describing sub-areas according to some embodiments. FIG. 15 is a diagram for schematically describing an intersection area according to some embodiments.

Referring to FIGS. 14A and 14B, the display panel DP may include the display area DA and the non-display area NDA outside the display area DA. The display panel DP may include the strain sensor layer 600, and the strain sensor layer 600 may include the horizontal sensing lines HSL extending in the first direction (x direction) in the display area DA and the vertical sensing lines VSL extending in the second direction (y direction) in the display area DA.

A plurality of horizontal sensing lines HSL and a plurality of vertical sensing lines VSL may be provided. The stretch compensation unit SCC (refer to FIG. 3) may divide the display area DA into a plurality of sub-areas SA11, SA12, . . . , SA32, and SA33 based on intersection areas CP11, CP12, . . . , CP32, and CP33 where the horizontal sensing lines HSL and the vertical sensing lines VSL intersect each other. When k horizontal sensing lines HSL (where k is a natural number greater than or equal to 2) are provided, and l vertical sensing lines VSL (where l is a natural number greater than or equal to 2) are provided, the plurality of sub-areas SA11, SA12, . . . , SA32, and SA33 may include k×l sub-areas.

For example, the horizontal sensing lines HSL may include the first horizontal sensing line HSL1 crossing the upper side (+y side) area of the display area DA, the second horizontal sensing line HSL2 crossing the central area of the display area DA, and the third horizontal sensing line HSL3 crossing the lower side (−y side) area of the display area DA. The vertical sensing lines VSL may include the first vertical sensing line VSL1 crossing the left side (−x side) area of the display area DA, the second vertical sensing line VSL2 crossing the central area of the display area DA, and the third vertical sensing line VSL3 crossing the right side (+x side) area of the display area DA. At this time, the horizontal sensing lines HSL and the vertical sensing lines VSL may intersect each other in nine intersection areas CP11, CP12, . . . , CP32, and CP33, and the stretch compensation unit SCC may divide the display area DA into nine sub-areas SA11, SA12, . . . , SA32, and SA33.

Each of a first-1 sub-area SA11, a first-2 sub-area SA12, and a first-3 sub-area SA13, through which the first horizontal sensing line HSL1 passes, may have a first width vw1 in the second direction (y direction), each of a second-1 sub-area SA21, a second-2 sub-area SA22, and a second-3 sub-area SA23, through which the second horizontal sensing line HSL2 passes, may have a second width vw2 in the second direction (y direction), and each of a third-1 sub-area SA31, a third-2 sub-area SA32, and a third-3 sub-area SA33, through which the third horizontal sensing line HSL3 passes, may have a third width vw3 in the second direction (y direction). Each of the first-1 sub-area SA11, the second-1 sub-area SA21, and the third-1 sub-area SA31, through which the first vertical sensing line VSL1 passes, may have a fourth width hw1 in the first direction (x direction), each of the first-2 sub-area SA12, the second-2 sub-area SA22, and the third-2 sub-area SA32, through which the second vertical sensing line VSL2 passes, may have a fifth width hw2 in the first direction (x direction), and the first-3 sub-area SA13, the second-3 sub-area SA23, and the third-3 sub-area SA33, through which the third vertical sensing line VSL3 passes, may have a sixth width hw3 in the first direction (x direction).

According to some embodiments, areas of the sub-areas SA11, SA12, . . . , SA32, and SA33 may be different from each other. According to some embodiments, as shown in FIG. 14A, the first width vw1 and the third width vw3 may be less than the second width vw2, and the fourth width hw1 and the sixth width hw3 may be less than the fifth width hw2. Accordingly, the area of the second-2 sub-area SA22, which is positioned at the center of the display area DA, may be greater than the areas of surrounding sub-areas. According to some embodiments, as shown in FIG. 14B, the first width vw1, the second width vw2, and the third width vw3 may be equal to each other, and the fourth width hw1, the fifth width hw2, and the sixth width hw3 may be equal to each other. In this case, each of the intersection areas CP11, CP12, . . . , CP32, and CP33 may be positioned at the central portion of a corresponding sub-area. Depending on an expected stretching direction of the display panel DP and a position of a vulnerable area where cracks are easily generated by stretching, the areas of the sub-areas SA11, SA12, . . . , SA32, and SA33 may be variously designed.

According to some embodiments, each of the horizontal sensing lines HSL and the vertical sensing lines VSL may have a zigzag curved shape in the intersection areas CP11, CP12, . . . , CP32, and CP33. Referring to FIG. 15, in the intersection area CP11, the first horizontal sensing line HSL1 may intersect with the first sub-sensing line VSL1*a* and the second sub-sensing line VSL1*b*. Because each of the first horizontal sensing line HSL1, the first sub-sensing line VSL1*a*, and the second sub-sensing line VSL1*b* has a zigzag curved shape in the intersection area CP11, the resistance and voltage of each of the first horizontal sensing line HSL1, the first sub-sensing line VSL1*a*, and the second sub-sensing line VSL1*b* may more sensitively change due to stretching in the intersection area CP11. According to some embodiments, because each of the horizontal sensing lines HSL and the vertical sensing lines VSL has a zigzag curved shape in a vulnerable area, the resistance and voltage of each of the horizontal sensing lines HSL and the vertical sensing lines VSL may more sensitively change due to stretching in the vulnerable area.

The stretch compensation unit SCC (refer to FIG. 3) may generate stretch compensation data SCD (refer to FIG. 3) that compensates for the image data DATA (refer to FIG. 3) in the unit of sub-areas by using comparison data. That is, the stretch compensation unit SCC may generate comparison data obtained by comparing a measurement voltage value with a reference voltage value for each of the horizontal sensing lines HSL and the vertical sensing lines VSL, select sub-areas that need stretch compensation based on the comparison data, and generate the stretch compensation data SCD for compensating for the luminance and/or color coordinates of pixels belonging to the selected sub-area.

The display apparatus 1 according to some embodiments may effectively compensate the entire surface of the display area DA with a small number of horizontal sensing lines HSL and vertical sensing lines VSL.

Figure 16:
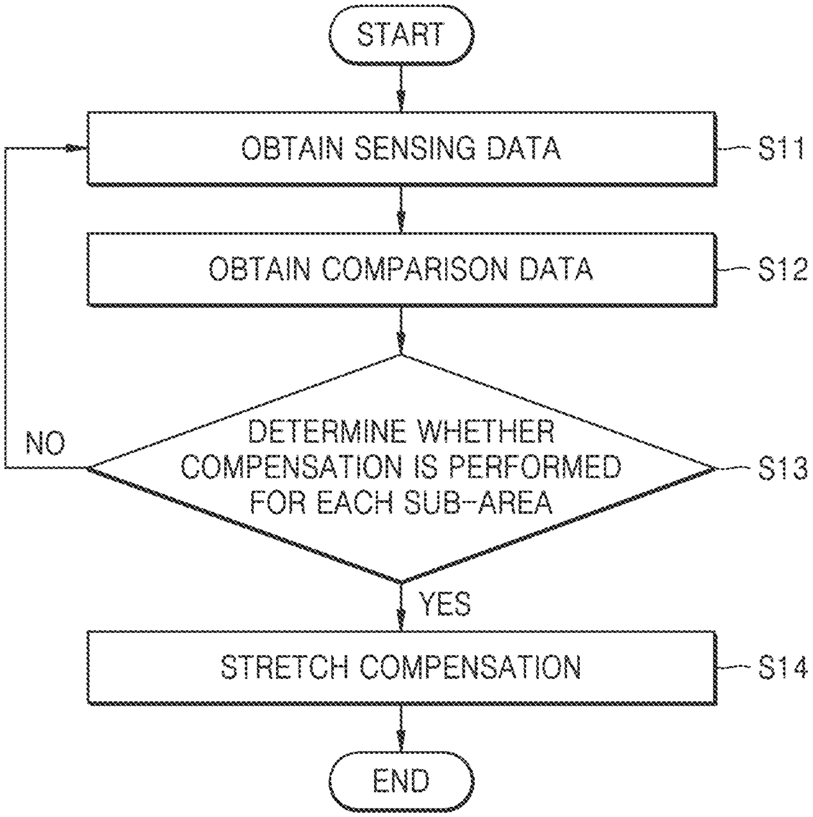
FIGS. 16 and 17 are diagrams illustrating aspects of a stretch compensation method of a display apparatus according to some embodiments.
Figure 17:
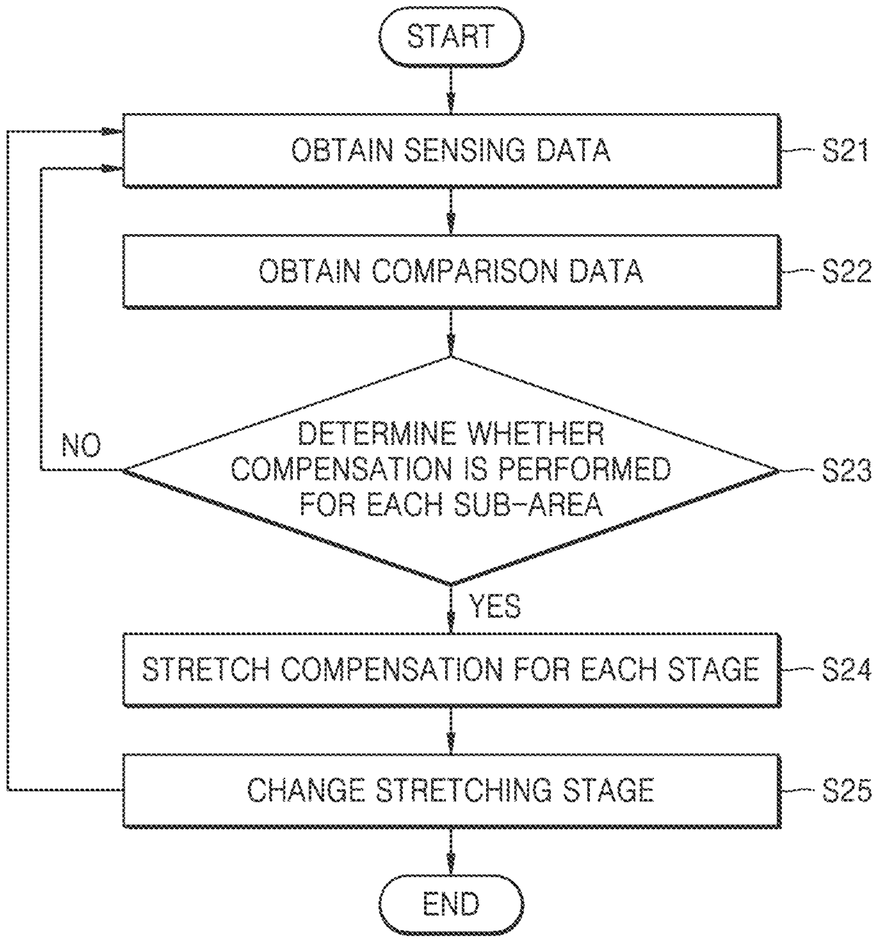

FIGS. 16 and 17 are diagrams each illustrating aspects of a stretch compensation method of a display apparatus according to some embodiments, FIG. 18A is a diagram for describing sensing data according to some embodiments, and FIG. 18B is a diagram for describing comparison data according to some embodiments. Although FIGS. 16 and 17 illustrate various operations in a stretch compensation method according to some embodiments, embodiments according to the present disclosure are not limited thereto, and according to various embodiments, the stretch compensation method may include additional operations or fewer operations without departing from the spirit and scope of embodiments according to the present disclosure.

Referring to FIGS. 3, 12, and 16 together, the stretch compensation method of the display apparatus 1 according to some embodiments may include operation S11 of obtaining sensing data, operation S12 of obtaining comparison data, operation S13 of determining whether compensation is performed for each sub-area, and operation S14 of performing stretch compensation.

In operation S11 of obtaining sensing data, the stretch compensation unit SCC may obtain a measurement voltage of each of the horizontal sensing lines HSL and the vertical sensing lines VSL, which are included in the strain sensor layer 600. The measurement voltage of each of the horizontal sensing lines HSL and the vertical sensing lines VSL may be transmitted to an input terminal of the comparator 71. The compensation controller 74 may generate sensing data based on the measurement voltage of each of the horizontal sensing lines HSL and the vertical sensing lines VSL. The sensing data may include a measurement voltage value of each of the horizontal sensing lines HSL and the vertical sensing lines VSL.

The sensing data may have a matrix structure as shown in FIG. 18A. For example, values in the first row and the first column may include a value of the first horizontal measurement voltage Vh1 of the first horizontal sensing line HSL1 and a value of the first vertical measurement voltage Vv1 of the first vertical sensing line VSL1, and values in the first row and the second column may include a value of the first horizontal measurement voltage Vh1 of the first horizontal sensing line HSL1 and a value of a second vertical measurement voltage Vv2 of the second vertical sensing line VSL2. According to some embodiments, the sensing data may be periodically stored in the memory 73. Initial voltage information including an initial voltage value of each of the horizontal sensing lines HSL and the vertical sensing lines VSL before stretching of the display panel DP may be stored in the memory 73.

In operation S12 of obtaining comparison data, the stretch compensation unit SCC may generate comparison data by comparing the measurement voltage value of each of the horizontal sensing lines HSL and the vertical sensing lines VSL with a reference voltage value. For example, one input terminal of an input terminal pair of the comparator 71 may receive a measurement voltage by being electrically connected to any one of the horizontal sensing lines HSL and the vertical sensing lines VSL, and the other one input terminal of the input terminal pair may receive a corresponding reference voltage by being electrically connected to the voltage supply circuit 72. Herein, the corresponding reference voltage is a measurement voltage at a time point when a change in luminance or color coordinates due to stretching of the display panel DP is recognized by the user and stretch compensation is required, which may be prestored in a manufacturing process of the display apparatus.

The comparator 71 may output a first value when the measurement voltage is less than or equal to the corresponding reference voltage, and may output a second value when the measurement voltage is greater than the corresponding reference voltage. According to some embodiments, the first value may be 1, and the second value may be 0, but the disclosure is not limited thereto. The compensation controller 74 may generate comparison data based on the output values of the comparator 71.

The comparison data may have a matrix structure as shown in FIG. 18B. For example, values in the first row and the first column may include an output value Bv_h1 of the comparator 71 for the first horizontal sensing line HSL1 and an output value Bv_v1 of the comparator 71 for the first vertical sensing line VSL1, and values in the first row and the second column may include the output value Bv_h1 of the comparator 71 for the first horizontal sensing line HSL1 and an output value Bv_v2 of the comparator 71 for the second vertical sensing line VSL2.

In operation S13 of determining whether compensation is performed for each sub-area, the stretch compensation unit SCC may select sub-areas that need compensation based on the comparison data. The stretch compensation unit SCC may divide the display area DA of the display panel DP into sub-areas corresponding to cells of data and select sub-areas that need compensation based on values of the cells. When the values of all cells of the comparison data are (0,0), the stretch compensation unit SCC may determine that all sub-areas have not been stretched to the extent that compensation is needed and may return to operation S11 of obtaining sensing data again. On the contrary, when one or more values of the cells of the comparison data are (1,0), (0,1) and/or (1,1), the stretch compensation unit SCC may determine that sub-areas corresponding to the cells need compensation. For example, when the values in the first row and the first column of the comparison data are (1,1), the compensation controller 74 may determine that the first-1 sub-area SA11 (refer to FIG. 14A) is stretched in the first direction (x direction) and the second direction (y direction) and compensation is needed. The compensation controller 74 may select, from among a plurality of look-up tables previously stored in the memory 73, a look-up table corresponding to the comparison data and generate the stretch compensation data SCD based on the selected look-up table.

According to some embodiments, the compensation controller 74 may determine a compensation strength in the unit of sub-areas based on a difference between the measurement voltage value and the initial voltage value. The compensation controller 74 may generate the stretch compensation data SCD including the compensation strength in the unit of sub-areas.

In operation S14 of performing stretch compensation, the stretch compensation unit SCC may transmit the stretch compensation data SCD to the display driving unit DDC. The display driving unit DDC may correct the image data DATA in the unit of sub-areas based on the stretch compensation data SCD.

Referring to FIGS. 3, 12, and 17 together, the stretch compensation method of the display apparatus 1 according to some embodiments may include operation S21 of obtaining sensing data, operation S22 of obtaining comparison data, operation S23 of determining whether compensation is performed for each sub-area, operation S24 of performing stretch compensation for each stage, and operation S25 of changing a stretching stage.

In operation S21 of obtaining sensing data, the stretch compensation unit SCC may obtain a measurement voltage of each of the horizontal sensing lines HSL and the vertical sensing lines VSL, which are included in the strain sensor layer 600. The compensation controller 74 may generate sensing data based on the measurement voltage of each of the horizontal sensing lines HSL and the vertical sensing lines VSL.

In operation S22 of obtaining comparison data, the stretch compensation unit SCC may generate comparison data by comparing the measurement voltage value of each of the horizontal sensing lines HSL and the vertical sensing lines VSL with a reference voltage value.

In operation S23 of determining whether compensation is performed for each sub-area, the stretch compensation unit SCC may select sub-areas that need compensation based on the comparison data. The stretch compensation unit SCC may divide the display area DA of the display panel DP into sub-areas corresponding to cells of data and select sub-areas that need compensation based on values of the cells.

In operation S24 of performing stretch compensation for each stage, the stretch compensation unit SCC may transmit, to the display driving unit DDC, different pieces of stretch compensation data SCD according to a stretching stage. According to some embodiments, the stretch compensation unit SCC may determine a stretching stage for each of the sub-areas. For example, in the initial state before the display panel DP is stretched, all sub-areas may be at a first stretching stage. After the display panel DP is stretched, the stretching stage of each of the sub-areas may be changed and different from each other.

The compensation controller 74 may generate the stretch compensation data SCD including compensation values for compensating for color coordinates of sub-areas at the first stretching stage and compensating for luminance of sub-areas at a second stretching stage.

According to some embodiments, the compensation controller 74 may generate the protection control signal PCS transmitted to the voltage generation unit 25 at a third stretching stage. The protection control signal PCS may correct an afterimage of an image by controlling the first power voltage VDD and/or the second power voltage VSS to be transmitted to the pixels PX. Alternatively, the protection control signal PCS may relatively reduce damage to the pixels PX due to stretching of the display panel DP by blocking the first power voltage VDD and/or the second power voltage VSS.

The compensation controller 74 may stop stretching of the display panel DP or shrink the display panel DP by generating a mechanical unit control signal for controlling the operation of a stretching mechanical unit that makes the display panel DP stretched at a fourth stretching stage.

Such stage-by-stage operations of the stretch compensation unit SCC are examples, and the disclosure is not limited thereto. For example, some stages may be omitted or added, and two or more operations may be simultaneously performed in each stage.

In operation S25 of changing the stretching stage, the stretch compensation unit SCC may change the stretching stage in the unit of sub-areas. For example, the stretching stage of a sub-area corresponding to a cell having values of (1,0), (0,1), and/or (1,1) in the comparison data may be changed to a following stage. The stretching stage of each sub-area may be stored in the memory 73. The voltage generation unit 25 may change a reference voltage of each of the corresponding horizontal sensing line HSL and the vertical sensing line VSL according to the stretching stage of each sub-area. For example, as the stretching stage of the first-1 sub-area SA11, the first-2 sub-area SA12, and the first-3 sub-area SA13, through which the first horizontal sensing line HSL1 passes, increases, the reference voltage of the first horizontal sensing line HSL1 may decrease. The reference voltage of each of the horizontal sensing line HSL and the vertical sensing line VSL may be prestored in the memory 73 for each stretching stage.

Figure 19:
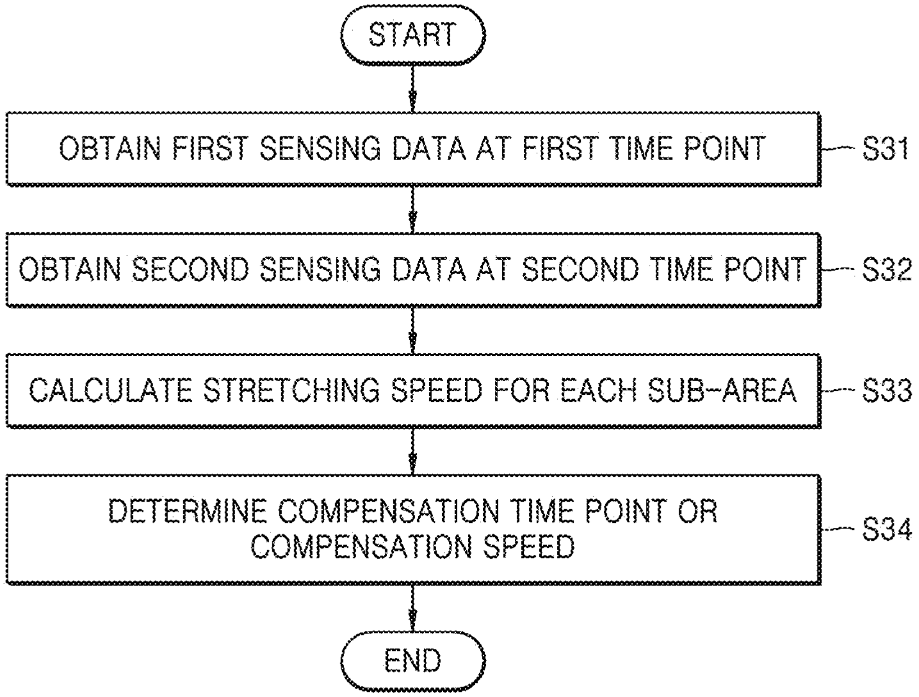
FIG. 19 is a diagram illustrating aspects of a stretch compensation method of a display apparatus according to some embodiments.

FIG. 19 is a diagram illustrating aspects of a stretch compensation method of a display apparatus according to some embodiments. Although FIG. 19 illustrates various operations in a stretch compensation method according to some embodiments, embodiments according to the present disclosure are not limited thereto, and according to various embodiments, the stretch compensation method may include additional operations or fewer operations without departing from the spirit and scope of embodiments according to the present disclosure.

Referring to FIGS. 3, 12, and 19 together, the stretch compensation method of the display apparatus according to some embodiments may further include operation S31 of obtaining first sensing data at a first time point, operation S32 of obtaining second sensing data at a second time point, operation S33 of calculating a stretching speed for each sub-area, and operation S34 of determining a compensation time point or a compensation speed.

In operation S31 of obtaining first sensing data at the first time point and operation S32 of obtaining second sensing data at the second time point, the stretch compensation unit SCC may store the first sensing data obtained at the first time point in the memory 73 and store the second sensing data at the second time point after a certain time has elapsed from the first time point in the memory 73. That is, the memory 73 may periodically store sensing data including a measurement voltage value of each of the horizontal sensing lines HSL and a measurement voltage value of each of the vertical sensing lines VSL.

In operation S33 of calculating the stretching speed for each sub-area, the stretch compensation unit SCC may calculate a stretching speed in the unit of sub-areas by comparing the first sensing data with the second sensing data. For example, the compensation controller 74 may calculate the stretching speed of the first-1 sub-area SA11 (refer to FIG. 14A) based on a difference between the values in the first row and the first column of the first sensing data and the values in the first row and the first column of the second sensing data.

In operation S34 of determining the compensation time point or the compensation speed, the stretch compensation unit SCC may determine the compensation time point and/or the compensation speed in the unit of sub-areas based on the calculated stretching speed. Herein, the compensation time point is a time point at which image compensation begins, and the compensation speed may mean a speed at which luminance or color coordinates gradually change. The compensation controller 74 may determine, based on the stretching speed, the compensation time point and/or the compensation speed so that the change in color coordinates and/or luminance of a sub-area is not recognized by the user, and may generate the stretch compensation data SCD including the compensation time point and/or the compensation speed. Accordingly, the display apparatus 1 according to some embodiments may prevent or reduce a change in color coordinates and/or luminance from being recognized by the user when stretching compensation is too fast or late, and may display a naturally corrected image according to the stretching speed of the display panel DP.

Figure 20:
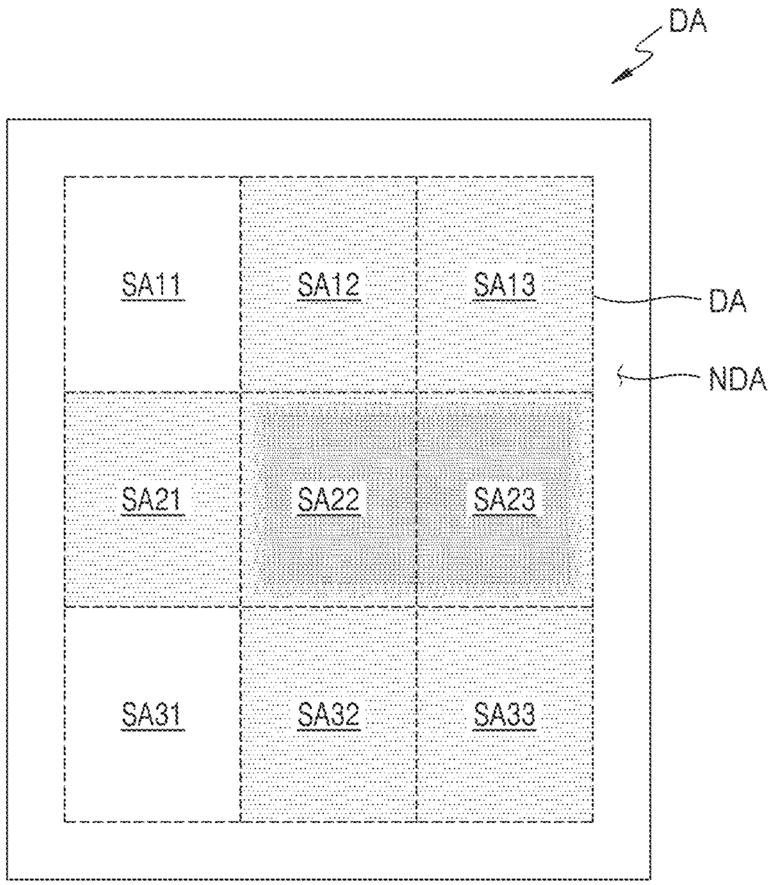
FIG. 20 is a plan view for describing a stretch compensation method of a display apparatus according to some embodiments.

FIG. 20 is a plan view for describing a stretch compensation method of a display apparatus according to some embodiments.

Referring to FIGS. 3 and 20 together, the display panel DP may include the display area DA and the non-display area NDA outside the display area DA. The stretch compensation unit SCC may divide the display area DA into the plurality of sub-areas SA11, SA12, . . . , SA32, and SA33, and may generate the stretch compensation data SCD compensating for the color coordinates and/or luminance in the unit of sub-areas.

When color coordinates and/or luminance are compensated in the unit of sub-areas, boundaries between the sub-areas may be recognized by the user. To prevent the above case, each of the plurality of look-up tables stored in the memory 73 includes stretch compensation values in the unit of sub-areas, but stretch compensation values corresponding to boundary areas between sub-areas among the stretch compensation values may have values interpolated to an average value.

FIG. 20 is a diagram for describing the case in which a compensation strength of color coordinates and/or luminance is set when sub-areas SA12, SA22, SA32, SA13, SA23, and SA33, which are positioned in the second and third columns, are stretched in the second direction (y direction), and the sub-areas SA21, SA22, and SA23, which are positioned in the second rows, are stretched in the second direction (x direction). The second-2 sub-area SA22 and the second-3 sub-area SA23 may have different compensation strengths of color coordinates and/or luminance from surrounding areas. The compensation strength of color coordinates and/or luminance at a boundary between sub-areas having different compensation strengths may be changed in a gradient. Accordingly, the display apparatus 1 according to some embodiments may display a naturally corrected image so that a boundary between sub-areas is not recognized by the user.

FIGS. 21A to 21G are schematic perspective views respectively showing the embodiments of electronic devices including a display panel according to some embodiments.

Figure 21A:
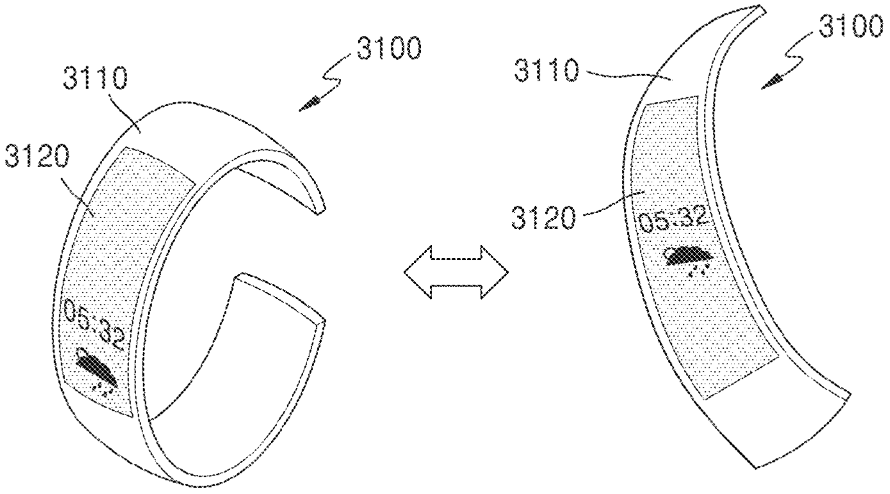
FIGS. 21A to 21G are schematic perspective views respectively showing the embodiments of electronic devices including a display panel according to some embodiments.

Referring to FIG. 21A, the display apparatus according to some embodiments may be used as a wearable electronic device 3100 which may be worn on a part of a user's body. The wearable electronic device 3100 may include a body portion 3110 and a display portion 3120 provided in the body portion 3110. The stretchable display apparatus according to embodiments may be used as the display portion 3120 of the wearable electronic device 3100. As shown in FIG. 21A, the wearable electronic device 3100 may be transformable. According to some embodiments, the wearable electronic device 3100 may be used as a smart watch or a smartphone depending on the user's choice.

Figure 21B:
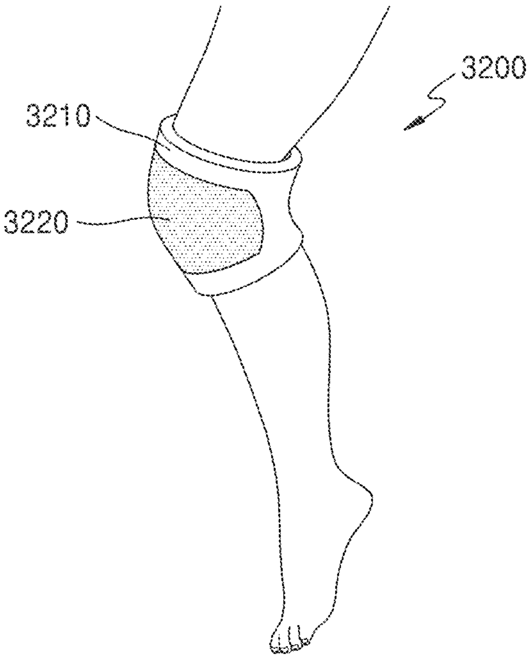

FIG. 21B shows a medical electronic device 3200. According to some embodiments, the medical electronic device 3200 may include a body portion 3210 and a light-emitting portion 3220. The stretchable display apparatus according to embodiments may be used as the light-emitting portion 3220 of the medical electronic device 3200. The light-emitting portion 3220 may emit light of a certain wavelength band (e.g., infrared light, visible light ray, or the like) to the body of a patient. According to some embodiments, the body portion 3210 may include a stretchable fiber material and may have a structure that the light-emitting portion 3220 may be worn on the user's body.

Figure 21C:
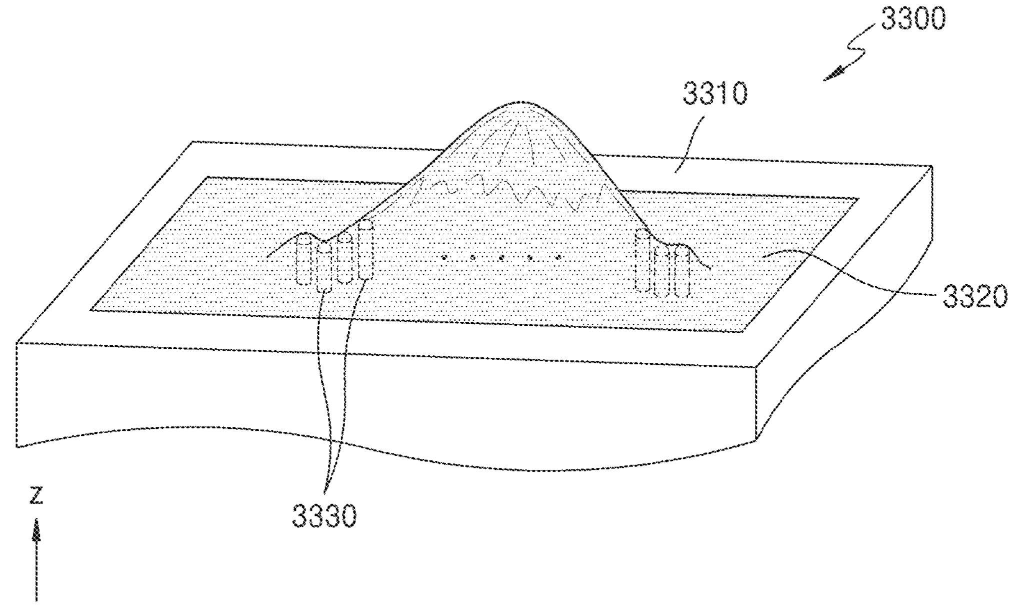

FIG. 21C shows an educational electronic device 3300. According to some embodiments, the educational electronic device 3300 may include a display portion 3320 provided in a frame 3310. The display portion 3320 may use the stretchable display apparatus according to embodiments. The display portion 3320 may provide images, such as a sea with waves, a mountain covered with snow, or a volcano with flowing lava, and at this time, the display portion 3320 may extend in a height direction (e.g., a z direction) by reflecting the height of the waves, the mountain, or the volcano. In some embodiments, a portion of the display portion 3320 may three-dimensionally show the movement of lava by sequentially changing the height along a direction in which the lava flows. The educational electronic device 3300 may include a plurality of pins (or stroke portions) 3330 arranged on the rear surface of the display portion 3320 so that the display portion 3320 may be stretched in the height direction. While the pins 3330 move along a third direction (e.g., a z direction or a −z direction), an image displayed on the display portion 3320 may be implemented to have a three-dimensional height. FIG. 21C shows the educational electronic device 3300, but the use is not limited as long as the device provides certain image information.

As shown in FIGS. 21A to 21C, an electronic device of which the shapes may be variable is described as the electronic device, but the disclosure is not limited thereto. As to be described below, the stretchable display apparatus according to embodiments may be used in an electronic device in which a portion capable of displaying images (e.g., a screen) is fixed.

Figure 21D:
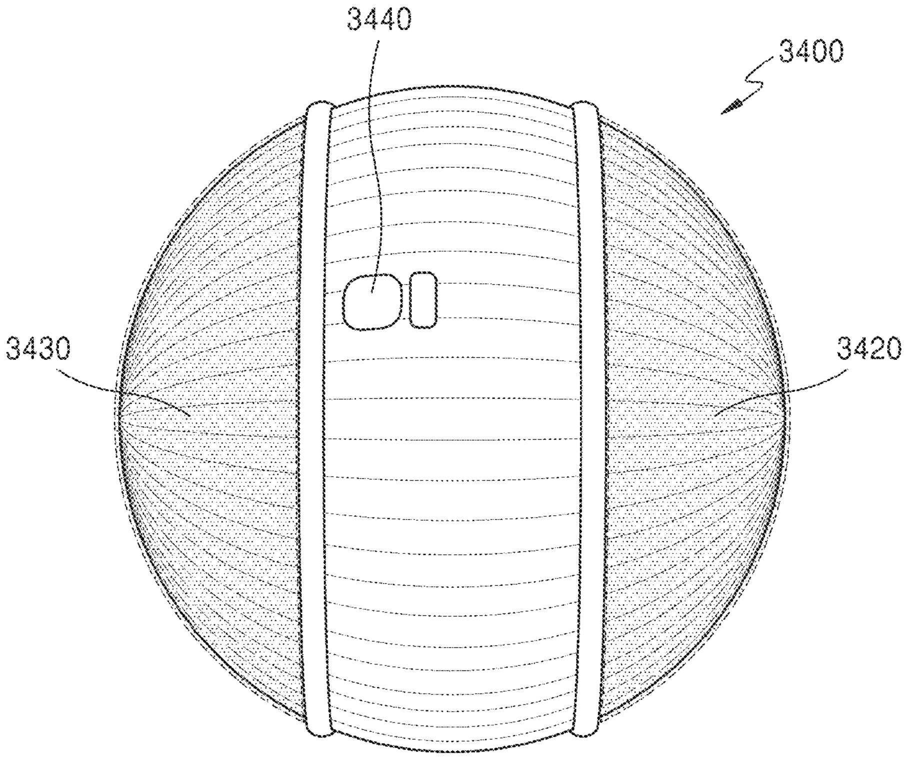

FIG. 21D shows a robot 3400 as an electronic device according to some embodiments. The robot 3400 may recognize movement or objects by using a camera unit 3440 and may display certain images through display portions 3420 and 3430. In some embodiments, as described above, because the stretchable display apparatus according to some embodiments may be stretched in various directions, the stretchable display apparatus may be assembled into a body frame having a hemispherical shape, and accordingly, the robot 3400 may include the display portions 3420 and 3430 having hemispherical shapes.

Figure 21E:
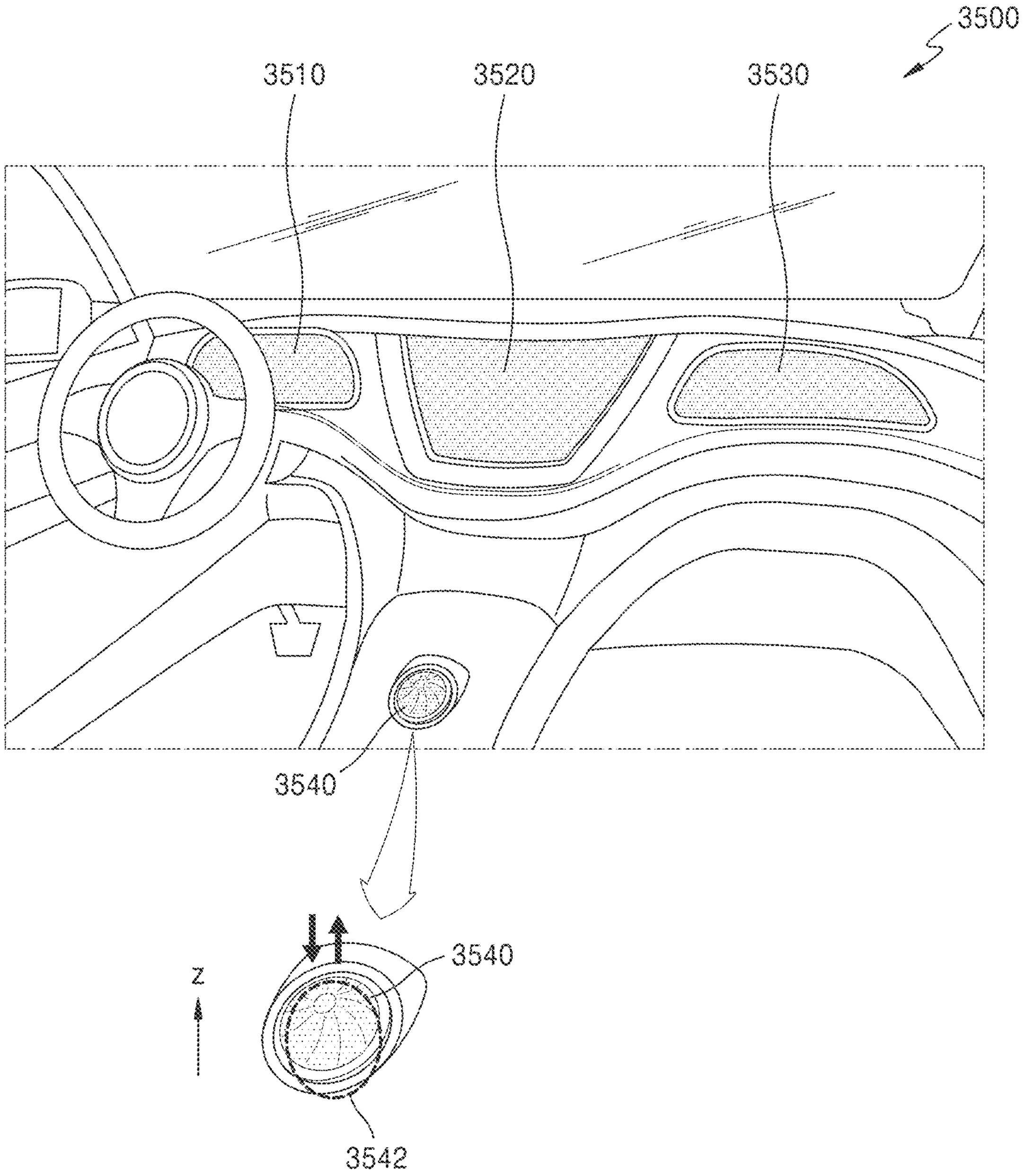

FIG. 21E shows a vehicle display apparatus 3500 as an electronic device according to some embodiments. The vehicle display apparatus 3500 may include a cluster 3510, a center information display (CID) 3520, and/or a co-driver display. Because the stretchable display apparatus according to some embodiments may be stretched in various directions, the stretchable display apparatus may be used in the cluster 3510, the CID 3520, and/or the co-driver display regardless of the shape of the internal frame of the vehicle.

FIG. 21E shows that the cluster 3510, the CID 3520, and the co-driver display are separated from each other, but the disclosure is not limited thereto. According to some embodiments, two or more selected from the cluster 3510, the CID 3520, and the co-driver display may be integrally connected to each other.

In some embodiments, the vehicle display apparatus 3500 may include a button 3540 that may display a certain image. Referring to the enlarged view of FIG. 21E, the button 3540 having a hemispherical shape may include an object 3542 that provides the feeling of using while moving in the z direction or the −z direction, and a stretchable display apparatus located on the object 3542. In some embodiments, when the object 3542 has a three-dimensionally rounded surface, the stretchable display apparatus may also have a three-dimensionally rounded surface.

Figure 21F:
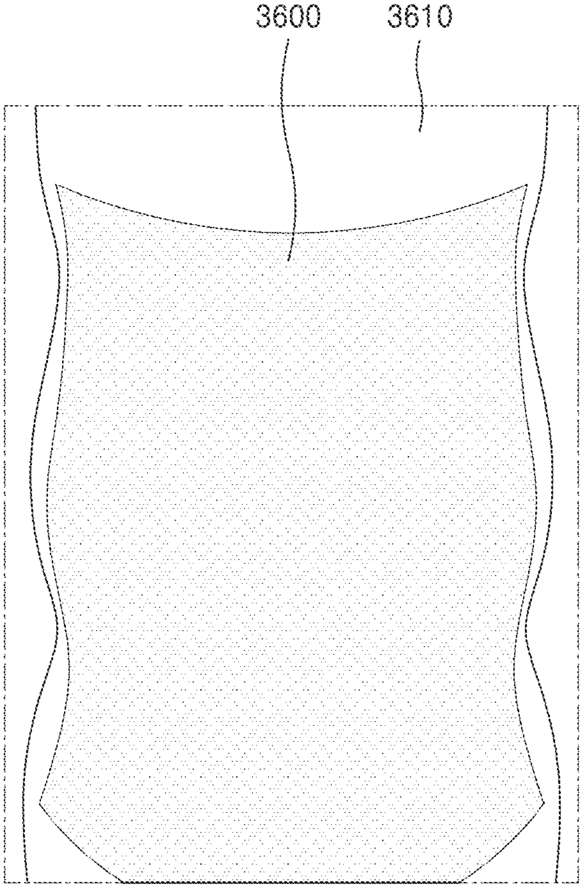

FIG. 21F shows that an electronic device according to some embodiments is an advertising or exhibiting electronic device 3600. In some embodiments, the advertising or exhibiting electronic device 3600 may be installed on a fixed structure 3610, such as a wall or pillar. When the structure 3610 includes an uneven surface as shown in FIG. 21F, the advertising or exhibiting electronic device 3600 may be arranged along the uneven surface of the structure 3610. In some embodiments, the advertising or exhibiting electronic device 3600 may be installed on the structure 3610 by using a heat shrink film or the like.

Figure 21G:
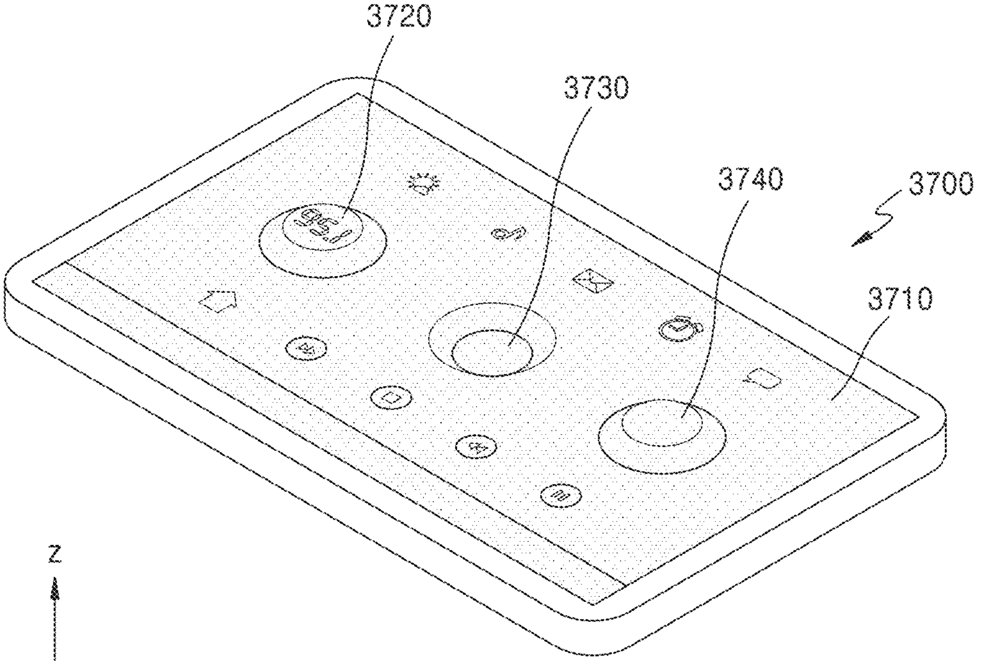

FIG. 21G shows that an electronic device according to some embodiments is a controller 3700. The controller 3700 may include an image-type button. For example, the controller 3700 may include first to third button areas 3720, 3730, and 3740 in which a partial area of a display portion 3710 protrudes in a z direction or a −z direction (or is depressed in the z direction). In some embodiments, the first and third button areas 3720 and 3740 may protrude in the z direction, and the second button area 3730 may protrude in the −z direction (or may be depressed in the z direction).

According to some embodiments as described above, a display apparatus having relatively improved display quality may be implemented. The scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:

a display layer comprising a display area in which a plurality of pixels are arranged and a non-display area outside the display area;

a strain sensor layer comprising first sensing lines extending in a first direction in the display area and second sensing lines extending in a second direction intersecting the first direction in the display area;

a display driving unit configured to provide image data to the plurality of pixels; and a stretch compensation unit configured to divide the display area into a plurality of sub-areas respectively comprising intersection areas where the first sensing lines and the second sensing lines intersect with other, to generate comparison data obtained by comparing a measurement voltage value with a reference voltage value for each of the first sensing lines and the second sensing lines, and to generate stretch compensation data correcting the image data in a unit of sub-areas based on the comparison data, wherein the stretch compensation unit comprises:

a memory storing a plurality of look-up tables and reference voltage information including a reference voltage value of each of the first sensing lines and the second sensing lines;

a voltage supply circuit configured to provide a reference voltage of each of the first sensing lines and the second sensing lines and a sensor driving voltage;

a comparator configured to compare a measurement voltage with a reference voltage for each of the first sensing lines and the second sensing lines to output a first value when the measurement voltage is less than or equal to the reference voltage and output a second value when the measurement voltage is greater than the reference voltage; and a compensation controller configured to generate the comparison data based on output values of the comparator, to select a look-up table corresponding to the comparison data from among the plurality of look-up tables and to generate stretch compensation data based on the selected look-up table.

2. The display apparatus of claim 1, wherein, k first sensing lines (where k is a natural number greater than or equal to 2) are provided, and l second sensing lines (where l is a natural number greater than or equal to 2) are provided, and the plurality of sub-areas comprise k×l sub-areas.

3. The display apparatus of claim 1, wherein the compensation controller is further configured to receive the reference voltage information and the measurement voltage value of each of the first sensing lines and the second sensing lines and determine a compensation strength in the unit of sub-areas based on a difference between the measurement voltage value and an initial voltage value for each of the first sensing lines and the second sensing lines, and the stretch compensation data comprises the compensation strength in the unit of sub-areas.

4. The display apparatus of claim 1, wherein the memory further stores first sensing data comprising a measurement voltage of each of the first sensing lines and the second sensing lines at a first time point and stores second sensing data comprising a measurement voltage of each of the first sensing lines and the second sensing lines at a second time point at which a certain time has elapsed from the first time point, the compensation controller is further configured to calculate a stretching speed in the unit of sub-areas by comparing the first sensing data with the second sensing data and determine a compensation time point or a compensation speed based on the stretching speed, and the stretch compensation data comprises the compensation time point or the compensation speed.

5. The display apparatus of claim 1, wherein each of the plurality of look-up tables comprises stretch compensation values in the unit of sub-areas, and stretch compensation values corresponding to boundary areas between the plurality of sub-areas among the stretch compensation values have interpolated values.

6. The display apparatus of claim 1, wherein, based on the comparator outputting the first value for a first-1 sensing line of the first sensing lines, the compensation controller is configured to determine that at least one of sub-areas through which the first-1 sensing line passes is stretched in the first direction.

7. The display apparatus of claim 1, wherein, based on the comparator outputting the first value for a second-1 sensing line of the second sensing lines, the compensation controller is configured to determine that at least one of sub-areas through which the second-1 sensing line passes is stretched in the second direction.

8. The display apparatus of claim 1, wherein, based on the comparator outputting the first value for a first-1 sensing line of the first sensing lines and a second-1 sensing line of the second sensing lines, the compensation controller is configured to determine that a sub-area where the first-1 sensing line and the second-1 sensing line intersect with each other is stretched in the first direction and the second direction.

9. The display apparatus of claim 1, wherein, based on the comparator outputting the first value for a first-1 sensing line of the first sensing lines and a second-1 sensing line of the second sensing lines, the compensation controller is configured to determine that a sub-area where the first-1 sensing line and the second-1 sensing line intersect with each other is stretched in a third direction crossing the first direction and the second direction.

10. The display apparatus of claim 1, wherein the compensation controller is further configured to determine a stretching stage for each of the plurality of sub-areas based on the comparison data, and the voltage supply circuit is further configured to differently supply the reference voltage of each of the first sensing lines and the second sensing lines for each stretching stage.

11. The display apparatus of claim 10, wherein the compensation controller is further configured to generate different pieces of the stretch compensation data according to the stretching stage.

12. The display apparatus of claim 10, wherein the stretching stage comprises a first stretching stage and a second stretching stage, and the compensation controller is further configured to generate the stretch compensation data comprising compensation values that compensate for color coordinates of sub-areas at the first stretching stage and compensate for luminance of sub-areas at the second stretching stage.

13. The display apparatus of claim 12, wherein the stretching stage further comprises a third stretching stage, and, at the third stretching stage, the compensation controller is configured to generate a protection control signal that controls a power voltage supplied to the plurality of pixels.

14. The display apparatus of claim 1, further comprising an encapsulation layer on the display layer, wherein the strain sensor layer is on the encapsulation layer.

15. The display apparatus of claim 1, further comprising a substrate comprising a first surface on which the display layer is located, and a second surface facing the first surface, wherein the strain sensor layer is on the second surface of the substrate.

16. The display apparatus of claim 1, further comprising a substrate on which the display layer is located, wherein the strain sensor layer is between the substrate and the display layer.

17. The display apparatus of claim 1, wherein each of the second sensing lines comprises a pair of first sub-sensing line and second sub-sensing line, the first sub-sensing line and the second sub-sensing line crossing the display area and being connected to each other in the non-display area, and the pair of first sub-sensing line and second sub-sensing line are adjacent to each other.

18. The display apparatus of claim 1, wherein each of the second sensing lines comprises a first portion crossing the display area and a second portion bypassing the display area and extending along the non-display area.

19. The display apparatus of claim 1, wherein each of the first sensing lines and the second sensing lines has a curved shape at the intersection areas.

* * * * *